US012229407B2

(12) United States Patent
Suk et al.

(10) Patent No.: US 12,229,407 B2
(45) Date of Patent: Feb. 18, 2025

(54) ELECTRONIC DEVICE COMPRISING HETEROGENEOUS MEMORIES AND METHOD FOR TRANSFERRING COMPRESSION DATA BETWEEN HETEROGENEOUS MEMORIES THEREOF

(71) Applicant: Samsung Electronics Co., Ltd., Suwon-si (KR)

(72) Inventors: Sooyong Suk, Suwon-si (KR); Chulmin Kim, Suwon-si (KR); Ohoon Kwon, Suwon-si (KR); Jaewon Kim, Suwon-si (KR); Jaeseon Sim, Suwon-si (KR); Yongtaek Lee, Suwon-si (KR); Hyunjoon Cha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 75 days.

(21) Appl. No.: 18/356,777

(22) Filed: Jul. 21, 2023

(65) Prior Publication Data

US 2023/0359355 A1 Nov. 9, 2023

Related U.S. Application Data

(63) Continuation of application No. PCT/KR2021/020007, filed on Dec. 28, 2021.

(30) Foreign Application Priority Data

Feb. 15, 2021 (KR) .......................... 10-2021-0019736

(51) Int. Cl.
*G06F 12/00* (2006.01)
*G06F 3/06* (2006.01)

(52) U.S. Cl.
CPC .......... *G06F 3/0608* (2013.01); *G06F 3/0647* (2013.01); *G06F 3/0673* (2013.01)

(58) Field of Classification Search
CPC .... G06F 3/0608; G06F 3/0647; G06F 3/0673; G06F 3/0656; G06F 3/0679
See application file for complete search history.

(56) References Cited

U.S. PATENT DOCUMENTS 8,375,191 B2 2/2013 Kim
8,554,990 B2 10/2013 Kwon et al.
(Continued)

FOREIGN PATENT DOCUMENTS

CN 111258923 A 6/2020
KR 10-2014-0075416 A 6/2014
(Continued)

*Primary Examiner* — John A Lane
(74) *Attorney, Agent, or Firm* — Jefferson IP Law, LLP

(57) ABSTRACT

An electronic device is provided. The electronic device includes a volatile memory for storing user data, a non-volatile memory, and a processor operatively connected to the volatile memory and the non-volatile memory. The processor may be configured to store first compressed objects, which are obtained by compressing some of the user data in a page unit, in an empty area of the volatile memory, to move a second compressed object, which satisfies a specified condition, from among the first compressed objects to a temporary buffer set in the volatile memory, and to move third compressed objects, which are stored in the temporary buffer, to the non-volatile memory in a compressed state when the temporary buffer is filled to have a specified size or more.

20 Claims, 11 Drawing Sheets

(56) References Cited

U.S. PATENT DOCUMENTS

| | | |
|---|---|---|
| 8,819,336 B2 | 8/2014 | Kwon et al. |
| 9,116,631 B2 | 8/2015 | Choi et al. |
| 9,141,532 B2 | 9/2015 | Horn |
| 9,176,808 B2 | 11/2015 | Shim et al. |
| 9,195,581 B2 | 11/2015 | Barbou-Des-Places et al. |
| 10,353,589 B2 | 7/2019 | Liang et al. |
| 10,657,041 B2 | 5/2020 | Doh et al. |
| 2005/0246513 A1 | 11/2005 | Oba |
| 2013/0007345 A1* | 1/2013 | Barbou-Des-Places ............... G06F 12/08 711/E12.103 |
| 2014/0164686 A1* | 6/2014 | Choi ............... G06F 3/0647 711/105 |
| 2016/0077960 A1* | 3/2016 | Hung ............... H03M 7/3086 711/103 |
| 2016/0092361 A1* | 3/2016 | Grimsrud ............ G06F 12/0833 711/146 |
| 2021/0397346 A1* | 12/2021 | Farhan ............... G06F 11/34 |
| 2022/0222012 A1* | 7/2022 | Matturi ............... G06F 3/0659 |

FOREIGN PATENT DOCUMENTS

| | | |
|---|---|---|
| KR | 10-1598727 B1 | 2/2016 |
| KR | 10-1602939 B1 | 3/2016 |
| KR | 10-1618634 B1 | 5/2016 |
| KR | 10-1809679 B1 | 12/2017 |
| KR | 10-1888074 B1 | 8/2018 |
| KR | 10-1946135 B1 | 2/2019 |
| KR | 10-2019-0060528 A | 6/2019 |
| KR | 10-2011135 B1 | 8/2019 |
| KR | 10-2020-0056046 A | 5/2020 |

* cited by examiner

ELECTRONIC DEVICE COMPRISING HETEROGENEOUS MEMORIES AND METHOD FOR TRANSFERRING COMPRESSION DATA BETWEEN HETEROGENEOUS MEMORIES THEREOF

CROSS-REFERENCE TO RELATED APPLICATION(S)

This application is a continuation application, claiming priority under § 365(c), of an International application No. PCT/KR2021/020007, filed on Dec. 28, 2021, which is based on and claims the benefit of a Korean patent application number 10-2021-0019736, filed on Feb. 15, 2021, in the Korean Intellectual Property Office, the disclosure of which is incorporated by reference herein in its entirety.

BACKGROUND

1. Field

The disclosure relates to an electronic device including heterogeneous memories and a method for moving compressed data between the heterogeneous memories thereof.

2. Description of Related Art

A semiconductor memory device for storing data includes a volatile memory device and a non-volatile memory device. While power is applied, a volatile memory device, which stores data by charging or discharging a cell capacitor, such as a dynamic random access memory (DRAM) keeps the stored data. However, when power is cut off, the volatile memory device loses the stored data. In the meantime, the non-volatile memory device may store data even when power is cut off. The volatile memory device is being mainly used as a main memory of an electronic device. The non-volatile memory device is being used as mass storage for programs and data in a wide range of application devices.

An electronic device such as a smart phone includes a volatile memory device and a non-volatile memory device. The electronic device may store various pieces of data in the volatile memory device and the non-volatile memory device.

The above information is presented as background information only to assist with an understanding of the disclosure. No determination has been made, and no assertion is made, as to whether any of the above might be applicable as prior art with regard to the disclosure.

SUMMARY

To secure free space of a volatile memory, an electronic device may compress and store some (e.g., data that has no access during a specific period) of user data. Moreover, the electronic device may further secure additional free space in the volatile memory by moving compressed data to a non-volatile memory. However, in the case, the electronic device may decompress data to be moved to the non-volatile memory and may store the decompressed data in the non-volatile memory. As such, because storage space consumed in the non-volatile memory is larger than additionally secured free space in a volatile memory, a method of securing additional free space in the volatile memory is inefficient.

Aspects of the disclosure are to address at least the above-mentioned problems and/or disadvantages and to provide at least the advantages described below. Accordingly, an aspect of the disclosure is to provide an electronic device that compresses user data to secure free space of the volatile memory and moves the compressed data in the compressed state to the non-volatile memory as it is.

Additional aspects will be set forth in part in the description which follows and, in part, will be apparent from the description, or may be learned by practice of the presented embodiments.

In accordance with an aspect of the disclosure, an electronic device is provided. The electronic device includes a volatile memory storing user data, a non-volatile memory, and a processor operatively connected to the volatile memory and the non-volatile memory. The processor may be configured to store first compressed objects, which are obtained by compressing some of the user data in a page unit, in an empty area of the volatile memory, move a second compressed object, which satisfies a specified condition, from among the first compressed objects to a temporary buffer set in the volatile memory, and move third compressed objects, which are stored in the temporary buffer, to the non-volatile memory in a compressed state when the temporary buffer is filled to have a specified size or more.

In accordance with another aspect of the disclosure, a method of moving compressed data between heterogeneous memories of an electronic device including a volatile memory and a non-volatile memory is provided. The method includes storing first compressed objects, which are obtained by compressing user data stored in the volatile memory in a page unit, in an empty area of the volatile memory, moving a second compressed object, which satisfies a specified condition, from among the first compressed objects to at least one temporary buffer set in the volatile memory, registering third compressed objects stored in the first temporary buffer in a write list in units of compressed object group when there is a first temporary buffer, which is filled to have a specified size or more, from among the at least one temporary buffer, and moving the compressed object groups to the non-volatile memory in compressed states when the number of compressed object groups registered in the write list is not less than a specified value.

According to the embodiments disclosed in this specification, it is possible to secure free space of a volatile memory in which a program is loaded onto an electronic device.

According to the embodiments disclosed in this specification, it is possible to store data, which is to be moved to a non-volatile memory in a compressed state, in the non-volatile memory to secure free space of volatile memory, thereby efficiently using the space of the non-volatile memory and minimizing the impact on the lifetime of the non-volatile memory.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
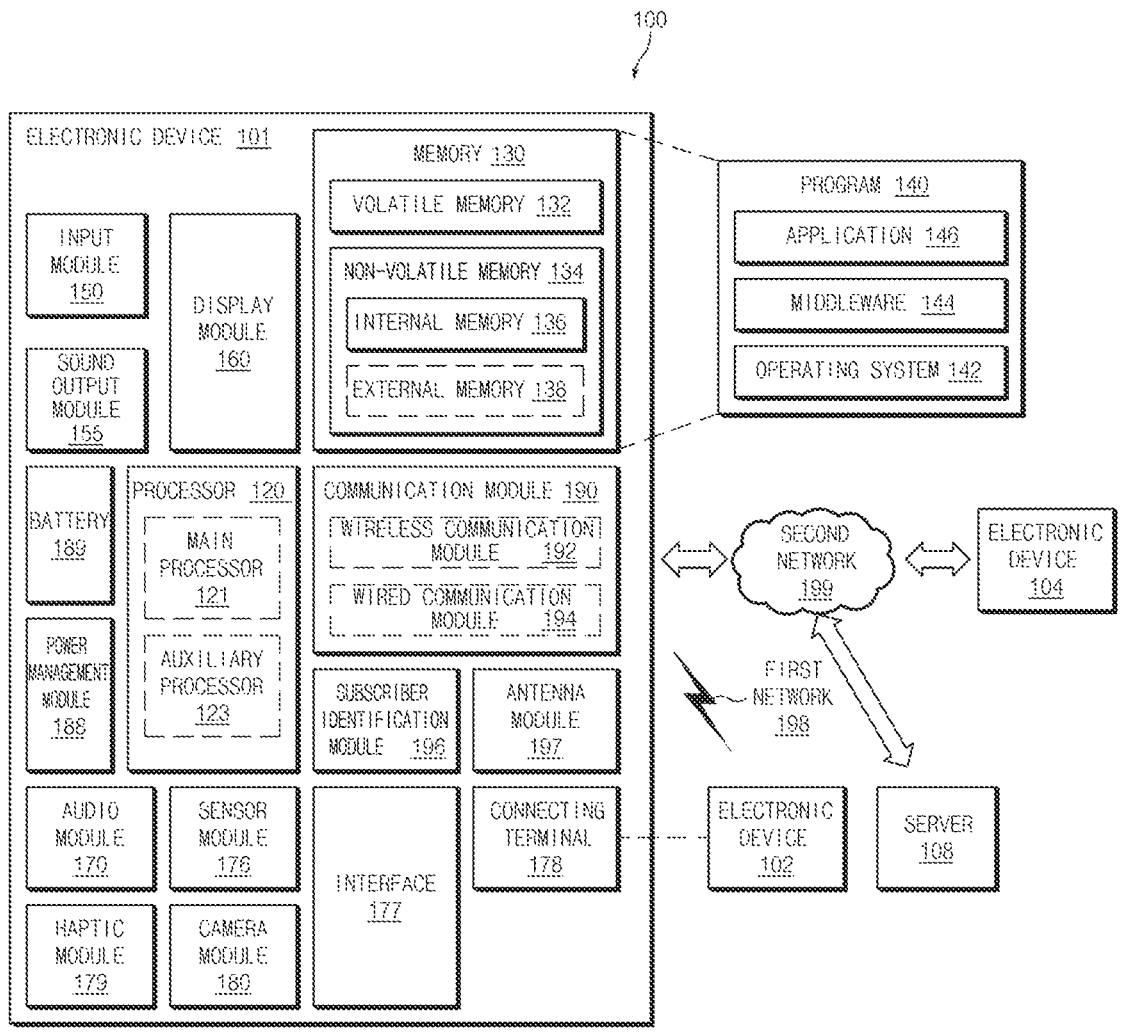
FIG. 1 is a block diagram of an electronic device in a network environment, according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., the electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

The connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 gigabits per second (Gbps) or more) for implementing eMBB, loss coverage (e.g., 164 decibels (dB) or less) for implementing mMTC, or U-plane latency (e.g., 0.5 milliseconds (ms) or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form an mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., antenna antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices (e.g., the electronic devices 102 and 104 or the server 108). For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
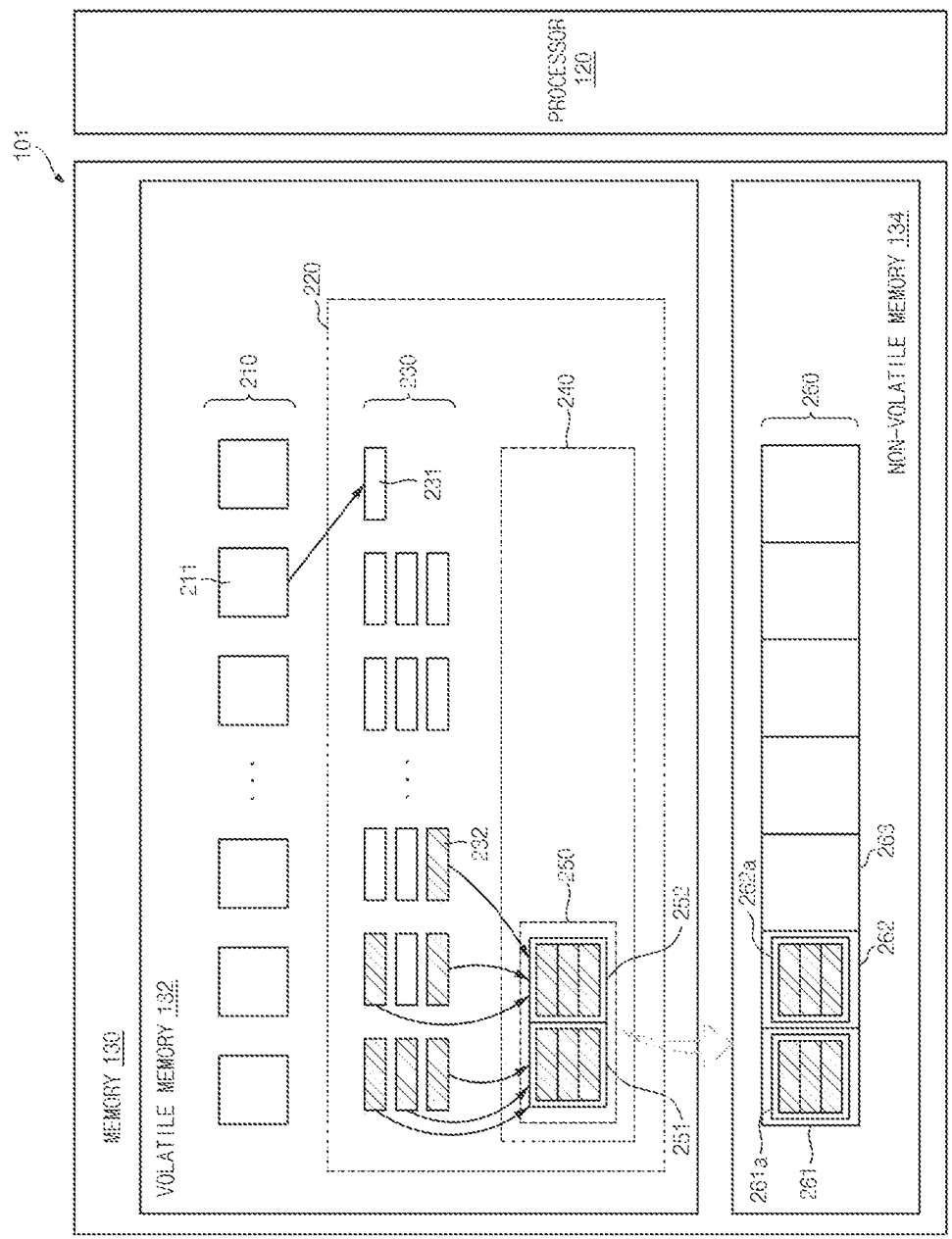
FIG. 2 is a diagram illustrating a method of moving compressed data between heterogeneous memories of an electronic device, according to an embodiment of the disclosure.

FIG. 2 is a diagram illustrating a method of moving compressed data between heterogeneous memories of an electronic device, according to an embodiment of the disclosure.

Referring to FIG. 2, an electronic device 101 may include a processor 120 and a memory 130. The memory 130 may include the volatile memory 132 and the non-volatile memory 134. The processor 120 may control the memory 130 by executing a program (e.g., the program 140). For example, a memory manager (e.g., a zram module) (not shown) of an operating system (e.g., the operating system 142 or kernel) may control the memory 130 through the processor 120. The memory manager may be implemented through software, hardware, or a combination thereof. Hereinafter, it is described that the processor 120 manages the memory 130, but this may include the meaning that the memory 130 is managed by the memory manager. The non-volatile memory 134 may include a plurality of storage slots 260.

According to an embodiment, the volatile memory 132 may store user data 210 accessed by the program. The user data 210 may be managed in units of page (e.g., 4 Kilobytes). The processor 120 (e.g., the memory manager (not shown) of the operating system 142) may compress partial data selected from the user data 210 and may store the compressed partial data as compressed objects 230. For example, when the free space of the volatile memory 132 is reduced to have a specified size (e.g., 10% of the size of the volatile memory 132) or less, the processor 120 may select and compress some of the user data 210. Alternatively, the processor 120 may select and compress a page, which has no access during a specified period or longer, in the user data 210. For example, when first page data 211 is selected, the processor 120 may generate a first compressed object 231 by compressing the first page data 211 and then may delete the first page data 211 (e.g., swap out). As such, the volatile memory 132 may secure free space, of which the size is equal to a size difference between the first page data 211 and the first compressed object 231. The processor 120 may store the first compressed object 231 in an empty area 220 (e.g., Zram) of the volatile memory 132. For example, the empty area 220 may mean a specified area of the volatile memory 132 or an entire free space of the volatile memory 132.

According to an embodiment, the processor 120 may perform an operation (e.g., Zram writeback) of moving compressed data between heterogeneous memories on the compressed objects 230. For example, the processor 120 may further secure free space of the volatile memory 132 by moving some of the compressed objects 230 stored in the empty area 220 to the non-volatile memory 134. The processor 120 may select at least one idle object 232 (e.g., the compressed object that is shaded in FIG. 2) from among the compressed objects 230 and may move the selected result to a temporary buffer layer 240. The idle object 232 may be defined as a compressed object, which has no access during a specified period or more, from among the compressed objects 230. For example, the processor 120 may attach an idle flag to all of the compressed objects 230 at a specified time point. When access to the compressed objects 230 is present, the processor 120 may remove an idle flag of the corresponding object. After the specified period elapses from the specified time point, the processor 120 may select a compressed object having the idle flag as the idle object 232. For another example, when the compressed data moving operation between heterogeneous memories is completed, the processor 120 may attach an idle flag to all the compressed objects 230. When performing the next compressed data moving operation between the heterogeneous memories, the processor 120 may select a compressed object having an idle flag as the idle object 232.

According to an embodiment, the temporary buffer layer 240 may include at least one temporary buffer. For example, the at least one temporary buffer may be classified for each size and may store the idle object 232. Alternatively, the processor 120 may set a storage limit size for the at least one respective temporary buffer. Furthermore, the at least one temporary buffer may be set to have a different size.

According to an embodiment, when a fully filled temporary buffer (e.g., a temporary buffer having free space of which the size is smaller than a specified size) is present from among the at least one temporary buffer, the processor 120 may register compressed objects, which are stored in the fully filled temporary buffer, in a write list in units of compressed object group. For example, the fully filled temporary buffer may include at least one compressed object group. The size of one compressed object group may correspond to a size (e.g., 4 Kilobytes) of one storage slot of the non-volatile memory 134.

According to an embodiment, when the number of compressed object groups registered in the write list is not less than a specified value, the processor 120 may move the compressed object groups registered in the write list from the volatile memory 132 to the non-volatile memory 134. (Alternatively, it may be stored in the non-volatile memory 134 and may be deleted in the volatile memory 132.) The compressed objects included in the compressed object groups thus registered may be moved into the non-volatile memory 134 in a compressed state as it is.

According to an embodiment, the processor 120 may move the compressed object groups thus registered to the non-volatile memory 134 in units of compression chunk. For example, one compression chunk may include a plurality of compressed object groups. During a write operation, the compressed object groups included in the one compression chunk may be continuously transmitted from the volatile memory 132 to the non-volatile memory 134. The compressed object groups included in the one compression chunk may be stored at a time (or continuously) in adjacent storage slots (e.g., a first storage slot 261 or a second storage slot 262) of the non-volatile memory 134. For example, depending on one write operation, the processor 120 may continuously store a first compressed object group 251 and a second compressed object group 252, which are included in a compression chunk 250, in the first storage slot 261 and the second storage slot 262 of the non-volatile memory 134, respectively. The first compressed object group 251 may be stored in the first storage slot 261 as a third compressed object group 261a. The second compressed object group 252 may be stored in the second storage slot 262 as a fourth compressed object group 262a. Afterward, the processor 120 may delete the first compressed object group 251 and the second compressed object group 252 from the volatile memory 132.

According to an embodiment, to manage compression chunks and compressed object groups, the processor 120 may use a plurality of bitmaps. For example, the plurality of bitmaps may have a hierarchical structure. The plurality of bitmaps may include an upper bitmap and a lower bitmap. Bits of the lower bitmap may be mapped one-to-one to the plurality of storage slots 260 of the non-volatile memory 134. As such, one bit of the lower bitmap may correspond to one compressed object group. 'N' bits (e.g., 'N' is a natural number greater than or equal to 2) of the lower bitmap may be mapped to one bit of the upper bitmap. As such, one bit of the upper bitmap may correspond to one compression chunk.

According to an embodiment, each bit of the upper bitmap or the lower bitmap may be displayed as a free bit (e.g., displayed as "logic 0" in binary) or a used bit (e.g., displayed as "logic 1" in binary). For example, a bit of the lower bitmap mapped to a storage slot (e.g., the first storage slot 261 or the second storage slot 262) of the non-volatile memory 134 in which a compressed object group is stored may be displayed as a used bit. A bit of the lower bitmap mapped to a storage slot (e.g., a third storage slot 263) of the non-volatile memory 134 in which a compressed object group is not stored may be displayed as a free bit. A bit of the upper bitmap mapped to at least one used bit of the lower bitmap may be displayed as a used bit. When all bits of the lower bitmap mapped to a specific bit of the upper bitmap are free bits, the specific bit of the upper bitmap may be expressed as a free bit.

According to an embodiment, firstly, the processor 120 may search for free bits in the upper bitmap and then may move compressed objects to the non-volatile memory 134 in units of compression chunk. Secondly, when a free bit is not found in the upper bitmap, the processor 120 may search for a free bit in the lower bitmap and may move compressed objects to the non-volatile memory 134 in units of compressed object group.

As described above, the processor 120 may secure free space of the volatile memory 132 by compressing some of the user data 210. Furthermore, the processor 120 may further secure free space of the volatile memory 132 by moving some of the compressed objects 230 to the non-volatile memory 134. Besides, the processor 120 may efficiently secure free space of the volatile memory 132 by moving compressed objects to be moved to the non-volatile memory 134 in a compressed state. In addition, the processor 120 may perform write operations of compressed objects for each unit (e.g., in units of compression chunk) larger than one storage slot of the non-volatile memory 134, thereby improving the write performance of the non-volatile memory 134 during a write operation.

Figure 3:
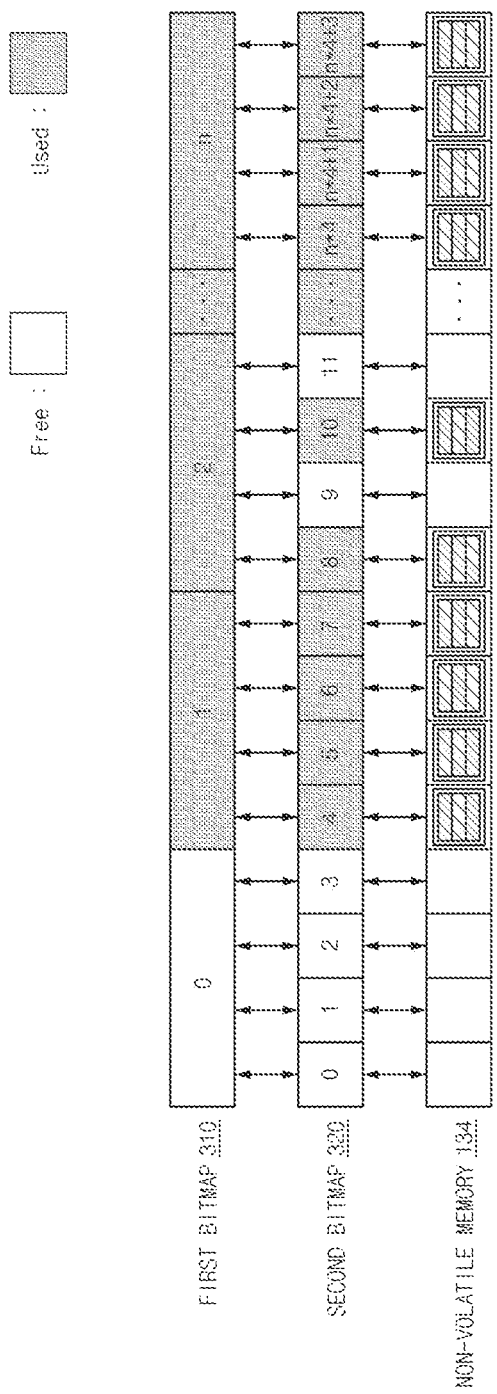
FIG. 3 is a diagram showing a bitmap used in the compressed data moving method of FIG. 2 according to an embodiment of the disclosure.

FIG. 3 is a diagram showing a bitmap used in the compressed data moving method of FIG. 2 according to an embodiment of the disclosure.

Referring to FIGS. 2 and 3, to manage a compression chunk and a compressed object group, a processor 120 may use a plurality of bitmaps. For example, the plurality of bitmaps may have a hierarchical structure. For example, the plurality of bitmaps may include an upper bitmap (e.g., a first bitmap 310) and a lower bitmap (e.g., a second bitmap 320). When the lower bitmap is the lowest bitmap, one bit of the lower bitmap may be mapped to one storage slot of the non-volatile memory 134.

According to an embodiment, the plurality of bitmaps may include a plurality of hierarchical structures. For example, although not shown in FIG. 3, an intermediate bitmap may be added between the first bitmap 310 and the second bitmap 320, and an additional upper bitmap may be added above the first bitmap 310. The processor 120 may perform a write operation at a time (or continuously) on storage slots (e.g., one compression chunk) of the non-volatile memory 134 mapped to one bit of the uppermost bitmap. However, for convenience of description, it is assumed that an upper bitmap (or the first bitmap 310) is the uppermost bitmap, and it is assumed that a lower bitmap (or the second bitmap 320) is the lowest bitmap.

According to an embodiment, bits of the lower bitmap (e.g., the second bitmap 320) may be mapped one-to-one to storage slots of the non-volatile memory 134. As such, one bit of the second bitmap 320 may correspond to one compressed object group.

According to an embodiment, a plurality of bits of the lower bitmap may be mapped to one bit of the upper bitmap. As such, one bit of the upper bitmap may correspond to one compression chunk. For example, 'N' bits (e.g., 'N' is a natural number greater than or equal to 2) of the lower bitmap may be mapped to one bit of the upper bitmap (e.g., the first bitmap 310). For example, in FIG. 3, four bits of the second bitmap 320 may be mapped to one bit of the first bitmap 310. However, this is only an example. For example, 'N' bits (e.g., 'N' is a natural number greater than or equal to 2) of the lower bitmap may be mapped to one bit of the upper bitmap.

According to an embodiment, each bit of the plurality of bitmaps may be displayed as a free bit (e.g., displayed as "logic 0" in binary) or a used bit (e.g., displayed as "logic 1" in binary). For example, each bit of the lower bitmap may indicate a use state of the mapped storage slot of the non-volatile memory 134. When the storage slot of the non-volatile memory 134 is empty, the processor 120 may indicate a corresponding bit of the lower bitmap as a free bit (or logic 0). When a compressed object is stored in a storage slot of the non-volatile memory 134, the processor 120 may indicate a corresponding bit of the lower bitmap as a used bit (or logic 1). Moreover, a bit of the upper bitmap mapped to at least one used bit of the lower bitmap may be indicated as a used bit. For example, in FIG. 3, because bit 8 and bit 10 of the second bitmap 320 are displayed as used bits, bit 2 of the first bitmap 310 may be displayed as a used bit. When all bits of the lower bitmap mapped to a specific bit of the upper bitmap are free bits, the specific bit of the upper bitmap may be expressed as a free bit. For example, in FIG. 3, because bit 0, bit 1, bit 2, and bit 3 of the second bitmap 320 are displayed as free bits, bit 0 of the first bitmap 310 may be indicated as a free bit.

Figure 4:
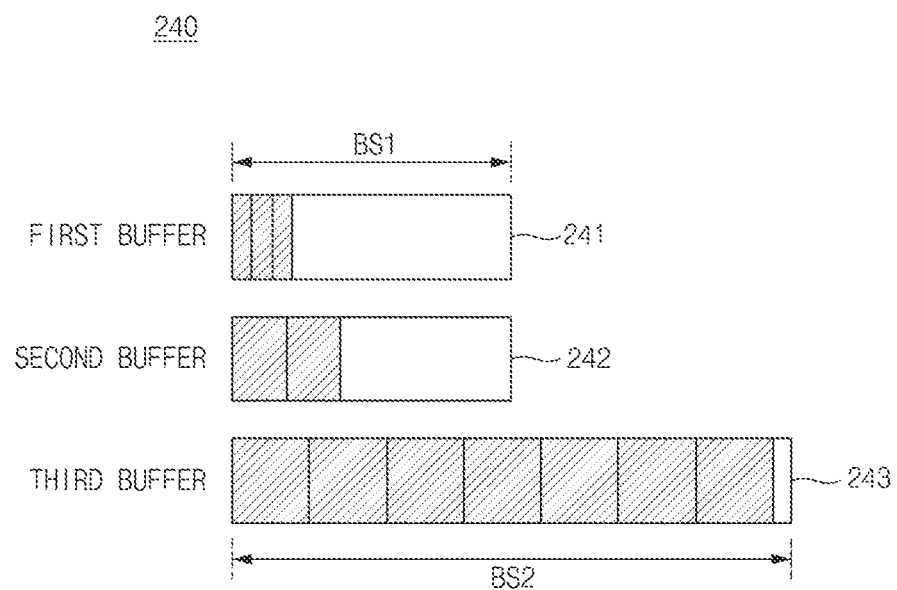
FIG. 4 is a diagram illustrating an example of a temporary buffer layer set in a volatile memory in the compressed data moving method of FIG. 2 according to an embodiment of the disclosure.

FIG. 4 is a diagram illustrating an example of a temporary buffer layer set in a volatile memory in the compressed data moving method of FIG. 2 according to an embodiment of the disclosure.

Referring to FIGS. 2 and 4, a temporary buffer layer 240 may include at least one temporary buffer. For example, the processor 120 may set the at least one temporary buffer to have various sizes. For example, the processor 120 may set a first buffer 241 and a second buffer 242 to have a first buffer size BS1 (e.g., 4 Kilobytes). The processor 120 may set a third buffer 243 to have a second buffer size BS2 (e.g., 8 Kilobytes). The processor 120 may set the second buffer size BS2 to a multiple of the first buffer size BS1.

According to an embodiment, compressed objects (e.g., the idle object 232) thus selected may be classified for each size and then may be moved to each temporary buffer. Alternatively, the processor 120 may set a storage limit size for the at least one respective temporary buffer. For example, the processor 120 may move compressed objects, each of which has a first compression size (e.g., 32 Bytes) or less, to the first buffer 241. The processor 120 may move compressed objects, each of which has a size that is greater than the first compression size and is not greater than the second compression size (e.g., 818 Bytes), to the second buffer 242. The processor 120 may move compressed objects, each of which has a size that is greater than the second compression size and is not greater than the third compression size (e.g., 1168 Bytes), to the third buffer 243.

According to an embodiment, when a fully filled temporary buffer (e.g., a temporary buffer having free space of which the size is smaller than a specified size) is present from among the at least one temporary buffer, the processor 120 may register compressed objects, which are stored in the fully filled temporary buffer, in a write list in units of compressed object group. For example, when free space has a size smaller than a specified size (e.g., the storage limit size) in each temporary buffer, the processor 120 may register a compressed object group, which is stored in a corresponding temporary buffer, in the write list. One temporary buffer may include at least one compressed object group. For example, when the size of free space in the first buffer 241 is smaller than a first compression size, the processor 120 may register compressed objects, which are stored in the first buffer 241, as one compressed object group in the write list. When the size of free space in the second buffer 242 is smaller than a second compression size, the processor 120 may register compressed objects, which are stored in the second buffer 242, as one compressed object group in the write list. When the size of free space in the third buffer 243 is smaller than a third compression size, the processor 120 may register compressed objects, which are stored in the third buffer 243, as two compressed object groups in the write list. The size of one compressed object group may correspond to a size (e.g., 4 Kilobytes) of one storage slot of the non-volatile memory 134.

Figure 5:
FIG. 5 is a diagram illustrating an example of a compression header generated when compressed data is moved in the compressed data moving method of FIG. 2 according to an embodiment of the disclosure.

FIG. 5 is a diagram illustrating an example of a compression header generated when compressed data is moved in the compressed data moving method of FIG. 2 according to an embodiment of the disclosure.

Referring to FIGS. 2 and 5, to search for a location of the moved compressed object at a read request of a compressed object moved to a non-volatile memory 134, a processor 120 may attach a compression header 510 to each compressed object. For example, the compression header 510 may include a first group index 511, a second group index 512, an offset 513, and a compression size 514. The second group index 512 may indicate a compressed object group that includes the corresponding compressed object. The first group index 511 may indicate the next compressed object group that includes the compressed object. For example, a fourth compressed object among compressed objects stored in the third buffer 243 of FIG. 4 may be positioned across two compressed object groups. When the fourth compressed object is stored in the non-volatile memory 134, the fourth compressed object may be stored in different storage slots. Accordingly, when the first group index 511 is not present, the processor 120 may determine that the corresponding compressed object belongs to only one compressed object group. When the first group index 511 is present, the processor 120 may determine that the corresponding compressed object belongs to two compressed object groups while being positioned across the two compression object groups. The offset 513 may indicate a starting point of the corresponding compressed object within the compressed object group. The compression size 514 may indicate a size of a compressed object.

For example, when the maximum size of one compressed object group is 4 Kilobytes, the compression header 510 may be generated to have a size of 8 bytes. Because the maximum size of a compressed object group is 4 Kilobytes, each of the offset 513 and the compression size 514 may be expressed as having 12 bits. Each of the first group index 511 and the second group index 512 may be expressed as having 20 bits. With respect to the non-volatile memory 134 of up to 4 Gigabytes, the first group index 511 or the second group index 512 of 20 bits may indicate a location where a compressed object group is stored.

Figure 6:
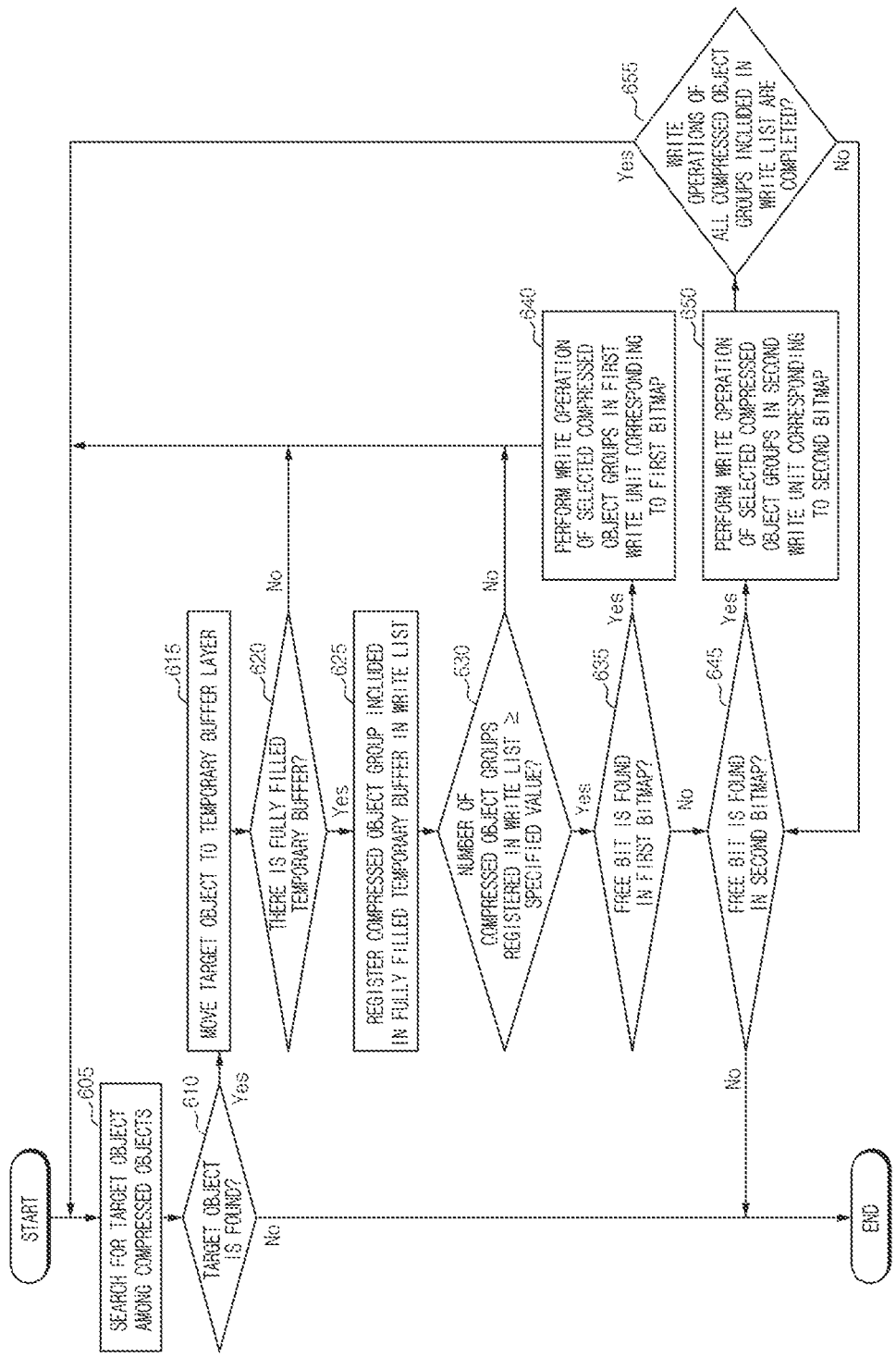
FIG. 6 is a flowchart illustrating a method of moving compressed data between heterogeneous memories of an electronic device, according to an embodiment of the disclosure.

FIG. 6 is a flowchart illustrating a method of moving compressed data between heterogeneous memories of an electronic device, according to an embodiment of the disclosure.

Referring to FIGS. 2 and 6, a processor 120 of an electronic device 101 may store first compressed objects (e.g., compressed objects 230), which are obtained by compressing a part of a user data 210 stored in a volatile memory 132 in units of page (e.g., 4 Kilobytes), in an empty area 220 of a volatile memory 132. For example, when free space of the volatile memory 132 is reduced to have a specified size (e.g., 10% of the size of the volatile memory 132), the processor 120 may generate the compressed objects 230 by compressing the part of the user data 210 in units of pages, may store the compressed objects 230 in the empty area 220 of the volatile memory 132, and may delete original data (e.g., the first page data 211). The processor 120 may perform an operation (e.g., Zram writeback) of moving compressed data between heterogeneous memories on the compressed objects 230.

According to an embodiment, in operation 605, the processor 120 may search for a target object among compressed objects. For example, when the compressed data moving command is triggered, the processor 120 may search for the target object, which satisfies a specified condition (e.g., when there is no access to the corresponding compressed object during a specified time), from among the compressed objects 230. The processor 120 may select the idle object 232 as the target object. The idle object 232 may be defined as a compressed object, which has no access during a specified period or more, from among the compressed objects 230. The processor 120 may determine whether an object is the idle object 232, from the oldest compressed object. For example, the processor 120 may attach an idle flag to all of the compressed objects 230 at a specified time point. When access to the compressed objects 230 is present, the processor 120 may remove an idle flag of the corresponding object. After the specified period elapses from the specified time point, the processor 120 may select a compressed object having the idle flag as the idle object 232. For another example, when the compressed data moving operation between heterogeneous memories is completed, the processor 120 may attach an idle flag to all the compressed objects 230. When performing the next compressed data moving operation between the heterogeneous memories, the processor 120 may select a compressed object having an idle flag as the idle object 232.

According to an embodiment, when the target object is not found in operation 610, the processor 120 may terminate the operation of moving compressed data between heterogeneous memories. When finding the target object in operation 610, the processor 120 may perform operation 615.

According to an embodiment, in operation 615, the processor 120 may move the target object to the temporary buffer layer 240. For example, the processor 120 may generate the temporary buffer layer 240 in the empty area 220 of the volatile memory 132. The temporary buffer layer 240 may include a plurality of temporary buffers. The plurality of temporary buffers may be classified for each size and may store the target object. Alternatively, the processor 120 may set a storage limit size for each of the plurality of temporary buffers. For example, the processor 120 may move a target object, of which the size is not greater than a first compression size (e.g., 32 Bytes), to the first buffer 241 of FIG. 4. The processor 120 may move a target object, of which the size is greater than the first compression size and is smaller than a second compression size (e.g., 818 Bytes), to the second buffer 242 of FIG. 4. Furthermore, the plurality of temporary buffers may be set to have different sizes. For example, the processor 120 may set the first buffer 241 and the second buffer 242 of FIG. 4 to have the first buffer size BS1. The processor 120 may set the third buffer 243 of FIG. 4 to have the second buffer size BS2 greater than the first buffer size BS1. The first buffer size BS1 may be set to correspond to a size (e.g., 4 Kilobytes) of one storage slot (e.g., the first storage slot 261) of the non-volatile memory 134. The second buffer size BS2 may be set to a multiple (e.g., 8 Kilobytes) of the first buffer size BS1.

According to an embodiment, in operation 620, the processor 120 may determine whether there is a fully filled temporary buffer. For example, the processor 120 may determine a temporary buffer having free space, of which the size is smaller than a specified size (e.g., the storage limit size set for the corresponding temporary buffer), as the fully filled temporary buffer. For example, when the free space, of which the size is smaller than a first compression size, is present in the first buffer 241 of FIG. 4, the processor 120 may determine the first buffer 241 of FIG. 4 as the fully filled temporary buffer. When there is no fully filled temporary buffer, the processor 120 may return to operation 605 and then may search for the next target object. When the fully filled temporary buffer is present, the processor 120 may perform operation 625.

According to an embodiment, in operation 625, the processor 120 may register a compressed object group included in the fully filled temporary buffer in a write list. For example, the fully filled temporary buffer may include at least one compressed object group. The size of one compressed object group may correspond to a size (e.g., 4 Kilobytes) of one storage slot of the non-volatile memory 134. For example, the first buffer 241 or the second buffer 242 of FIG. 4, which has the first buffer size BS1, may include one compressed object group. When the second buffer size BS2 is twice the first buffer size BS1, the third buffer 243 of FIG. 4 having the second buffer size BS2 may include two compressed object groups.

According to an embodiment, in operation 630, the processor 120 may identify the number of compressed object groups registered in the write list. When the number of compressed object groups registered in the write list is less than a specified value, the processor 120 may return to operation 605 and then may search for the next target object. When the number of compressed object groups registered in the write list is greater than or equal to the specified value, the processor 120 may move compressed object groups registered in the write list to the non-volatile memory 134 through operation 635, operation 640, operation 645, operation 650, and operation 655.

According to an embodiment, in operation 635, the processor 120 may search for a free bit in a first bitmap (e.g., an upper bitmap). For example, the processor 120 may manage storage slots of the non-volatile memory 134 by using a plurality of bitmaps. The plurality of bitmaps may be implemented hierarchically. For example, the plurality of bitmaps may include the first bitmap (e.g., the first bitmap 310 or the upper bitmap in FIG. 3) and a second bitmap (e.g., the second bitmap 320 or the lower bitmap in FIG. 3). One bit of the second bitmap may be mapped to one storage slot of the non-volatile memory 134. One bit of the first bitmap may be mapped to a plurality of bits of the second bitmap. Accordingly, one bit of the first bitmap may correspond to a plurality of slots of the non-volatile memory 134. In addition, each bit of the first bitmap or the second bitmap may be displayed as a free bit (e.g., displayed by "logic 0" in binary) or used bit (e.g., displayed by "logic 1" in binary). For example, a bit of the second bitmap mapped to a slot in which a compressed object group is stored may be displayed as a used bit. A bit of the second bitmap mapped to a slot in which a compressed object group is not stored may be displayed as a free bit. A bit of the first bitmap mapped to at least one used bit of the second bitmap may be displayed as a used bit. When all the bits of the second bitmap mapped to a specific bit of the first bitmap are free bits, the specific bit of the first bitmap may be expressed as a free bit. When the free bit is found in the first bitmap, the processor 120 may perform operation 640. When the free bit is not found in the first bitmap, the processor 120 may perform operation 645.

According to an embodiment, in operation 640, the processor 120 may perform a write operation of selected compressed object groups in a first write unit (e.g., a compression chunk unit) corresponding to the first bitmap. For example, one bit of the first bitmap (e.g., the first bitmap 310 in FIG. 3) may be mapped to a plurality of slots of the non-volatile memory 134. The first write unit may be determined based on the total size of a plurality of slots of the non-volatile memory 134 mapped to one bit of the first bitmap. For example, referring to FIG. 3, the processor 120 may store four compressed object groups corresponding to one bit of the first bitmap 310 of FIG. 3 in the non-volatile memory 134 at a time (or continuously). The processor 120 may delete compressed object groups stored in the non-volatile memory 134 from the temporary buffer layer 240. The processor 120 may change bits of the first bitmap and the second bitmap mapped to storage slots of the non-volatile memory 134, in which compressed object groups are stored, into used bits. Moreover, when a plurality of free bits are found in the first bitmap, the processor 120 may move compressed object groups, which are registered in the write list having a capacity corresponding to the plurality of free bits, to the non-volatile memory 134 at a time (or continuously).

According to an embodiment, when a free bit is not found in the first bitmap, in operation 645, the processor 120 may search for a free bit in the second bitmap. When a free bit is not found in the second bitmap, there may be no storage space in the non-volatile memory 134, and thus the processor 120 may terminate the operation of moving compressed data between heterogeneous memories. When a free bit is found in the second bitmap, the processor 120 may perform operation 650.

According to an embodiment, in operation 650, the processor 120 may perform a write operation of selected compressed object group in a second write unit (e.g., a compressed object group unit) corresponding to the second bitmap. For example, the second write unit may be smaller than the first write unit of operation 640. The second write unit may be determined based on the size (e.g., 4 Kilobytes) of one storage slot of the non-volatile memory 134 mapped to one bit of the second bitmap. The processor 120 may move the oldest compressed object group among the compressed object groups registered in the write list to a storage slot of the non-volatile memory 134 mapped to the free bit of the second bitmap.

According to an embodiment, in operation 655, the processor 120 may determine whether write operations of all the compressed object groups included in the write list are completed. When the write operations of all the compressed object groups included in the write list are completed, the processor 120 may return to operation 605 and then may search for the next target object. When there are remaining compressed object groups to be moved to the non-volatile memory 134 in the write list, the processor 120 may repeat operation 645, operation 650, and operation 655 until the write operations of all the compressed object groups included in the write list are completed.

As described above, the processor 120 may secure free space of the volatile memory 132 by compressing some of the user data 210. Furthermore, the processor 120 may move the compressed objects included in the write list to the non-volatile memory 134, thereby further securing the free space of the volatile memory 132. Moreover, the processor 120 may move the compressed objects to the non-volatile memory 134 in a compressed state, thereby efficiently securing the free space of the volatile memory 132. In addition, the processor 120 may perform write operations of the compressed objects for each unit (e.g., the first write unit or the compression chunk unit) larger than one storage slot of the non-volatile memory 134, thereby improving the write performance of the non-volatile memory 134 during a write operation.

Figure 7:
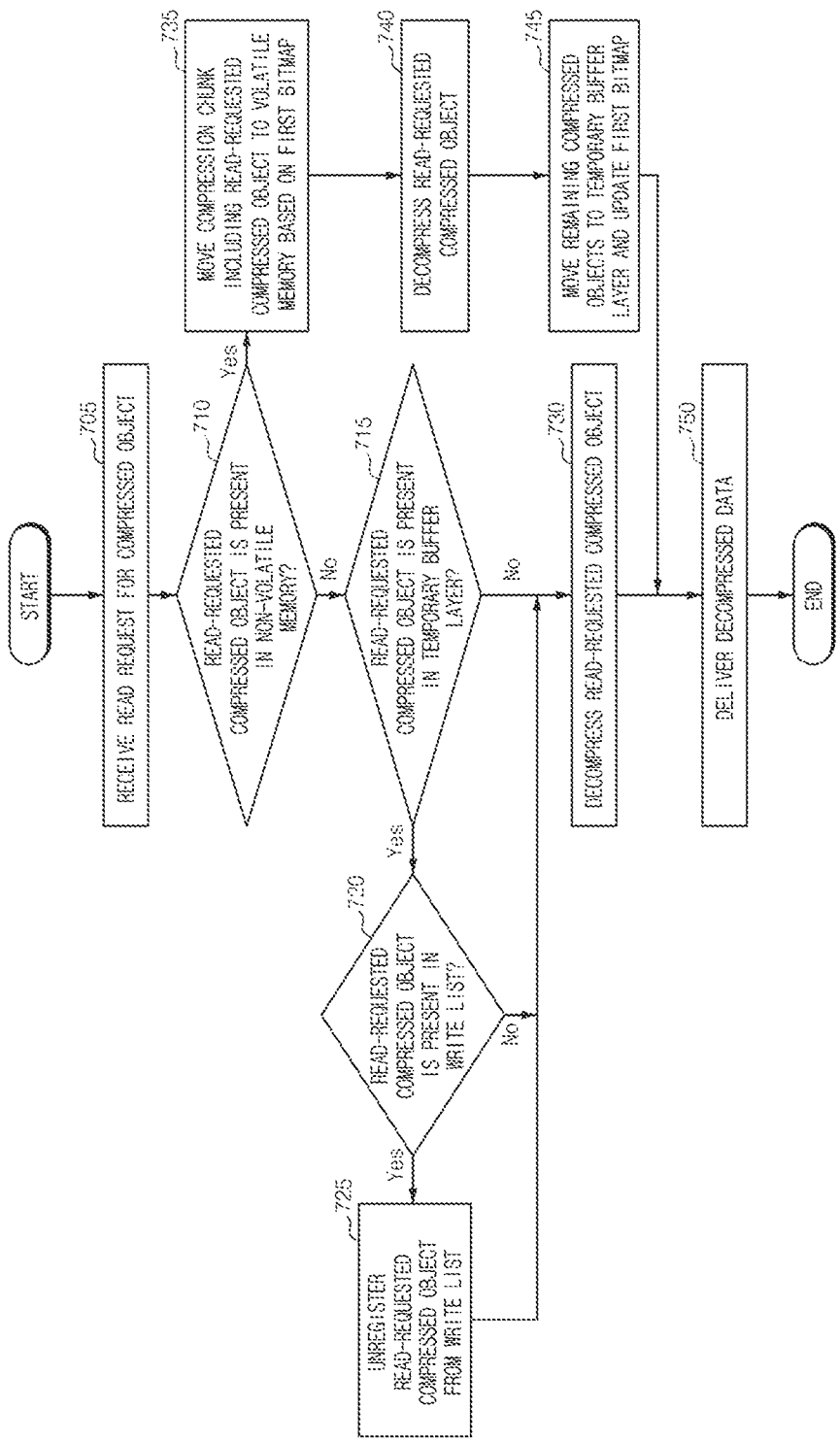
FIG. 7 is a flowchart illustrating an example of a read operation of an electronic device, according to an embodiment of the disclosure.

FIG. 7 is a flowchart illustrating an example of a read operation of an electronic device, according to an embodiment of the disclosure.

Referring to FIGS. 2 and 7, a volatile memory 132 may store an uncompressed user data 210, compressed objects 230, which are compressed and stored in an empty area 220, in a user data 210, and a compressed object group (e.g., first compressed object group 251 or second compressed object group 252), which is moved to and then stored in a temporary buffer layer 240, from among compressed objects 230. The non-volatile memory 134 may store a compressed object group (e.g., the third compressed object group 261a or the fourth compressed object group 262a) stored through a compressed data moving operation (e.g., Zram writeback) between heterogeneous memories.

According to an embodiment, in operation 705, the processor 120 of the electronic device 101 may receive a read request (e.g., a read request by the program 140 of FIG. 1) for a compressed object. For example, the read-requested compressed object may be included in the compressed objects 230 compressed and stored in the empty area 220 of the volatile memory 132, included in a compressed object group moved to the temporary buffer layer 240 of the volatile memory 132, or included in a compressed object group stored in the non-volatile memory 134 through an operation (e.g., Zram writeback) of moving compressed data between heterogeneous memories.

According to an embodiment, in operation 710, the processor 120 may determine whether the read-requested compressed object is present in the non-volatile memory 134. When the read-requested compressed object is present in the non-volatile memory 134, the processor 120 may decompress the read-requested compressed object through operation 735, operation 740, and operation 745. When the read-requested compressed object is not present in the non-volatile memory 134 (e.g., No of operation 710), the processor 120 may perform operation 715.

According to an embodiment, in operation 715, the processor 120 may determine whether the read-requested compressed object is present in the temporary buffer layer 240 of the volatile memory 132. When the read-requested compressed object is not present in the temporary buffer layer 240, the processor 120 may determine that the read-requested compressed object is included in the compressed objects 230 compressed and stored in the empty area 220 of the volatile memory 132 and then may perform operation 730. When the read-requested compressed object is present in the temporary buffer layer 240 (e.g., Yes of operation 715), the processor 120 may perform operation 720.

According to an embodiment, in operation 720, the processor 120 may determine whether the read-requested compressed object is present in the write list. When the read-requested compressed object is not present in the write list, the processor 120 may determine that the read-requested compressed object is stored in the temporary buffer while not registered in the write list, and then may perform operation 730. When the read-requested compressed object is present in the write list (e.g., Yes of operation 720), the processor 120 may perform operation 725.

According to an embodiment, in operation 725, the processor 120 may unregister the read-requested compressed object from the write list. For example, the read-requested compressed object has been registered in the write list in operation 625 of FIG. 6, but is not yet moved to the non-volatile memory 134. In this case, the processor 120 may unregister a compressed object group including the read-requested compressed object from the write list. The processor 120 may move the read-requested compressed object to the empty area 220 of the volatile memory 132, and may keep the remaining compressed objects included in the compressed object group in a temporary buffer as it is.

According to an embodiment, when the read-requested compressed object is not moved to the temporary buffer layer 240 of the volatile memory 132 and is present in the empty area 220 (e.g., No of operation 715), in operation 730, the processor 120 may decompress the read-requested compressed object. Alternatively, when the read-requested compressed object has been moved to the temporary buffer layer 240 but is not registered on the write list (e.g., No of operation 720), the processor 120 may decompress the read-requested compressed object. Alternatively, when the read-requested compressed object is registered in the write list, the processor 120 may unregister a compressed object group including the read-requested compressed object from the write list (e.g., operation 725) and may decompress the read-requested compressed object. For example, the compressed object thus decompressed may be restored to page data (e.g., the first page data 211).

According to an embodiment, when the read-requested compressed object is present in the non-volatile memory 134 (e.g., Yes of operation 710), in operation 735, the processor 120 may move a compression chunk including the read-requested compressed object from the non-volatile memory 134 to the volatile memory 132 based on the first bitmap (or an upper bitmap). For example, one bit of the first bitmap may be mapped to a plurality of slots of the non-volatile memory 134. For example, one bit of the first bitmap may correspond to one compression chunk. The compression chunk including the read-requested compressed object may include a compressed object group including the read-requested compressed object and the other compressed object groups. The processor 120 may store a compression chunk including the read-requested compressed object in the volatile memory 132 and may process storage slots of the non-volatile memory 134, in each of which the compression chunk is stored, such that the storage slots of the non-volatile memory 134 are invalid.

According to an embodiment, in operation 740, the processor 120 may decompress the read-requested compressed object. For example, the processor 120 may search for the read-requested compressed object in a compressed object group including the read-requested compressed object by using the compression header 510 of FIG. 5. The read-requested compressed object may be included in one compressed object group or may be included in two compressed object groups while being positioned across the two compressed object groups. The compressed object thus decompressed may be restored to page data (e.g., the first page data 211).

According to an embodiment, in operation 745, the processor 120 may move the remaining compressed objects to the temporary buffer layer 240 without decompression. For example, the compression chunk may include a compressed object group including the read-requested compressed object and the other compressed object groups. A compressed object group including the read-requested compressed object may include the read-requested compressed object and first remaining compressed objects. The remaining compressed object groups may include second remaining compressed objects. The processor 120 may store the first remaining compressed objects and the second remaining compressed objects in a temporary buffer again. The first remaining compressed objects and the second remaining compressed objects may be moved to the non-volatile memory 134 later through the compressed data moving operation between heterogeneous memories of FIG. 6. The first remaining compressed objects and the second remaining compressed objects may be stored in a temporary buffer according to the method described in FIG. 4. Moreover, in the first bitmap and the second bitmap (or a lower bitmap), the processor 120 may update bits corresponding to a compression chunk including the read-requested compressed object to free bits.

According to an embodiment, in operation 750, the processor 120 may deliver the decompressed page data to a subject (e.g., the program 140 of FIG. 1) of the read request.

Figure 8:
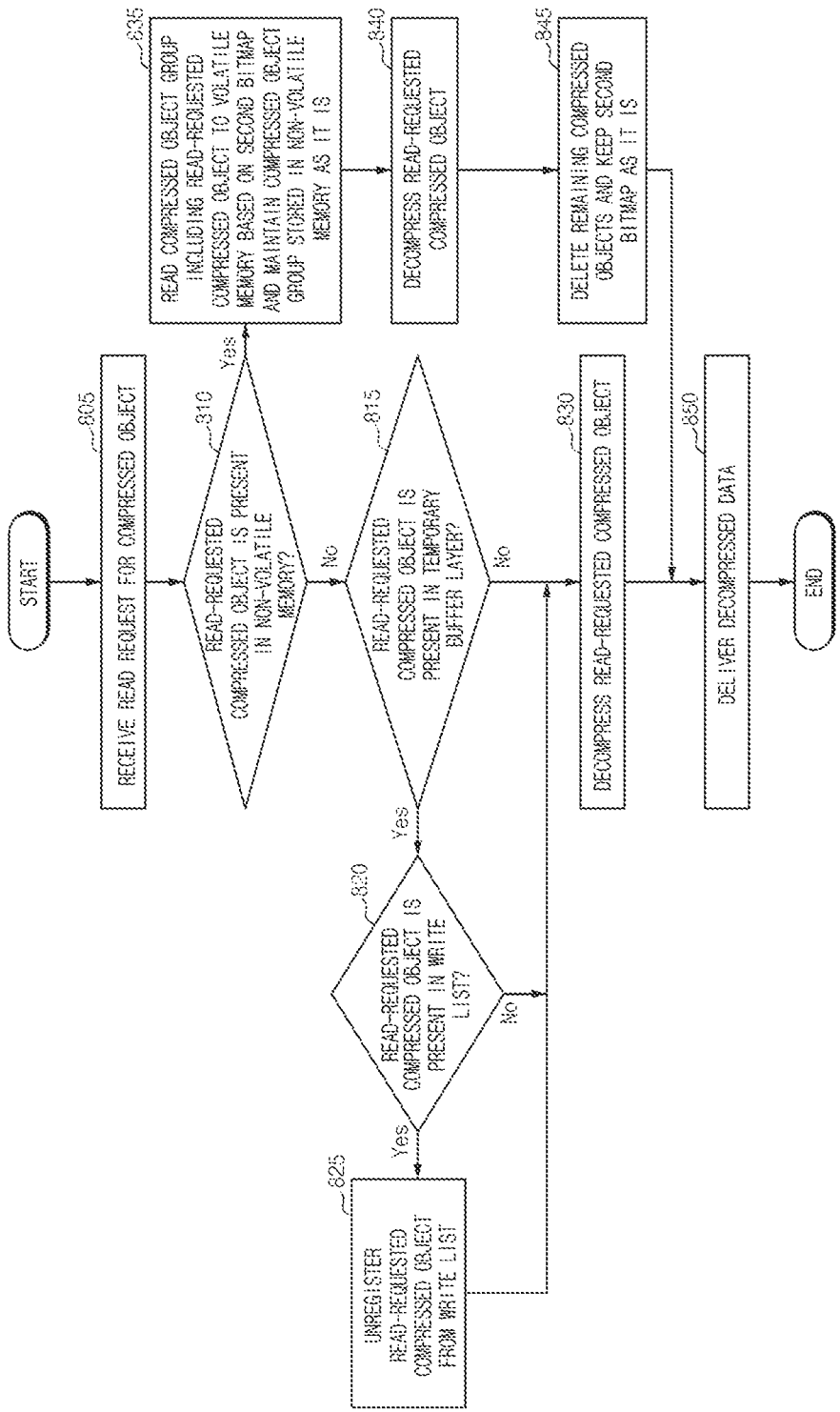
FIG. 8 is a flowchart illustrating an example of a read operation of an electronic device, according to an embodiment of the disclosure.

FIG. 8 is a flowchart illustrating an example of a read operation of an electronic device, according to an embodiment of the disclosure.

Referring to FIGS. 2 and 8, a volatile memory 132 may store uncompressed user data 210, compressed objects 230, which are compressed and stored in an empty area 220, in a user data 210, and a compressed object group (e.g., a first compressed object group 251 or a second compressed object group 252), which is moved to and then stored in a temporary buffer layer 240, from among the compressed objects 230. The non-volatile memory 134 may store a compressed object group (e.g., the third compressed object group 261*a* or the fourth compressed object group 262*a*) stored through a compressed data moving operation (e.g., Zram writeback) between heterogeneous memories.

According to an embodiment, in operation 805, the processor 120 of the electronic device 101 may receive a read request (e.g., a read request by the program 140 of FIG. 1) for a compressed object. For example, the read-requested compressed object may be included in the compressed objects 230 compressed and stored in the empty area 220 of the volatile memory 132, included in a compressed object group moved to the temporary buffer layer 240 of the volatile memory 132, or included in a compressed object group stored in the non-volatile memory 134 through an operation (e.g., Zram writeback) of moving compressed data between heterogeneous memories.

According to an embodiment, in operation 810, the processor 120 may determine whether the read-requested compressed object is present in the non-volatile memory 134. When the read-requested compressed object is present in the non-volatile memory 134, the processor 120 may decompress the read-requested compressed object through operation 835, operation 840, and operation 845. When the read-requested compressed object is not present in the non-volatile memory 134 (e.g., No of operation 810), the processor 120 may decompress the read-requested compressed object through operation 815, operation 820, operation 825, and operation 830. Because operation 815 to operation 830 may be the same as or similar to operation 715 to operation 730 of FIG. 7, descriptions of portions identical or similar to portions in operation 715 to operation 730 of FIG. 7 are omitted.

According to an embodiment, when the read-requested compressed object is present in the non-volatile memory 134 (e.g., Yes of operation 810), in operation 835, the processor 120 may copy a compressed object group including the read-requested compressed object from the non-volatile memory 134 to the volatile memory 132 based on the second bitmap (or a lower bitmap). The non-volatile memory 134 may maintain a storage state of the compressed object group including the read-requested compressed object as it is. For example, when the read-requested compressed object is included in only one compressed object group, the processor 120 may copy only one compressed object group. When the read-requested compressed object is included in two compressed object groups while being positioned across the two compressed object groups, the processor 120 may copy the two compressed object groups.

According to an embodiment, in operation 840, the processor 120 may decompress the read-requested compressed object. For example, the processor 120 may search for the read-requested compressed object in the compressed object group (or compressed object groups) copied in operation 835 by using the compression header 510 of FIG. 5. The processor 120 may decompress only the read-requested compressed object and may maintain compression states of the remaining compressed objects included in the compressed object group (or compressed object groups) copied in operation 835.

According to an embodiment, in operation 845, the processor 120 may delete the remaining compressed objects, excluding the page data (e.g., the page data 211) obtained by decompressing the read-requested compressed object. The processor 120 may keep the first bitmap (an upper bitmap) and the second bitmap (or a lower bitmap) as they are.

According to an embodiment, in operation 850, the processor 120 may deliver decompressed data corresponding to the read-requested compressed object to a subject (e.g., the program 140 of FIG. 1) of the read request.

According to an embodiment, the processor 120 may separately use the compressed object read method of FIG. 7 and the compressed object read method of FIG. 8. Alternatively, the processor 120 may concurrently use the compressed object reading method of FIG. 7 and the compressed object reading method of FIG. 8 depending on use situations of the volatile memory 132 and the non-volatile memory 134.

Figure 9:
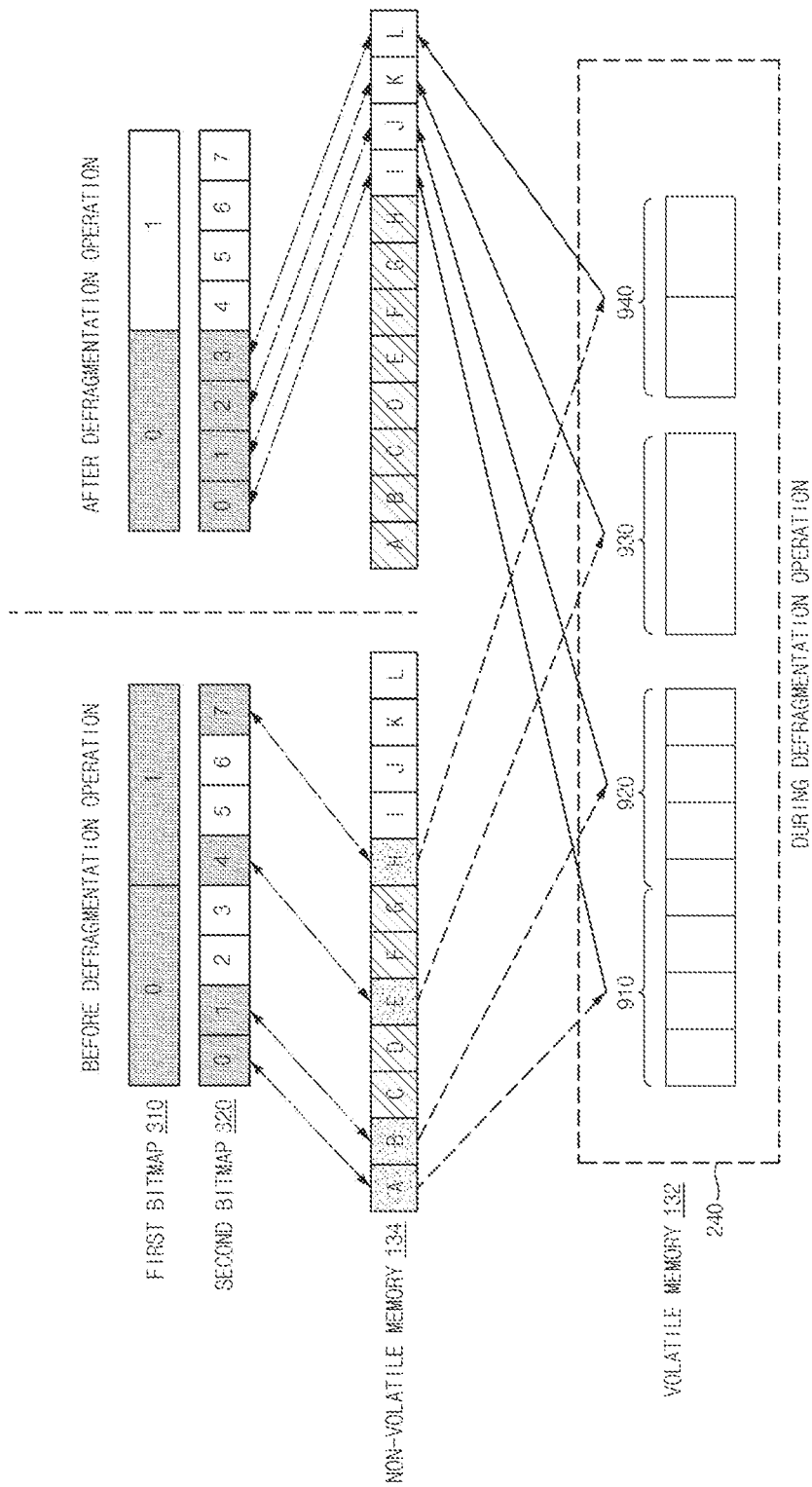
FIG. 9 is a diagram illustrating a defragmentation operation of a non-volatile memory of an electronic device, according to an embodiment of the disclosure.

FIG. 9 is a diagram illustrating a defragmentation operation of a non-volatile memory of an electronic device, according to an embodiment of the disclosure.

Referring to FIGS. 2 and 9, a non-volatile memory 134 may be fragmented (e.g., a slot not mapped to a bitmap is present between slots mapped to the bitmap) depending on a usage pattern (e.g., a read operation, a write operation, or an erase operation). Through a defragmentation operation (e.g., defragmentation), the processor 120 may move compressed objects stored in the non-volatile memory 134 to the volatile memory 132 and then may relocate the compressed objects in the non-volatile memory 134.

According to an embodiment, the processor 120 may determine whether a start condition of the defragmentation operation is satisfied. For example, because the performance of the electronic device 101, which is perceived by a user, may be degraded during the defragmentation operation, the processor 120 may perform the defragmentation operation by using a period in time in which a user input is not entered. For example, the processor 120 may identify an idle time of the electronic device 101. The processor 120 may determine the idle time of the electronic device 101 based on an off time or local time (e.g., early morning hours (00:00~05:00)) of a display (e.g., the display module 160). Moreover, the processor 120 may determine whether the defragmentation operation is necessary. For example, when the upper bitmap includes used bits having a specified percentage or higher, the processor 120 may perform the defragmentation operation. When the usable lifespan of the non-volatile memory 134 is not less than a reference value (e.g., when a wear level is sufficiently low), the processor 120 may perform the defragmentation operation.

According to an embodiment, the processor 120 may select a target compression chunk based on an upper bitmap (e.g., the first bitmap 310). For example, the processor 120 may select a compression chunk (or a compression chunk corresponding to the used bit of the first bitmap having the number of bits of the mapped second bitmap (or a lower bitmap) that corresponds to a specified ratio or less), of which the usage amount corresponds to a specified ratio (e.g., 50%) or less, as a target compression chunk based on a used bit of the first bitmap 310. For example, when the specified ratio is set to 50%, the processor 120 may select a first compression chunk corresponding to bit 0 of the first bitmap 310 and a second compression chunk corresponding to bit 1 of the first bitmap 310 as the target compression chunk before performing the defragmentation operation. In bit 0 of the first bitmap 310, only two lower bits (e.g., bit 0 and bit 1 of the second bitmap 320) among four lower bits (e.g., bit 0, bit 1, bit 2, and bit 3 of the second bitmap 320) remain as used bits. In bit 1 of the first bitmap 310, only two lower bits (e.g., bit 4 and bit 7 of the second bitmap 320) among the four lower bits (e.g., bit 4, bit 5, bit 6, and bit 7 of the second bitmap 320) remain as used bits.

According to an embodiment, the processor 120 may move the target compression chunk from the non-volatile memory 134 to the temporary buffer layer 240 of the volatile memory 132. For example, when the first compression chunk is selected as the target compression chunk, the processor 120 may copy compressed object groups stored in storage slot A and storage slot B of the non-volatile memory 134 to the temporary buffer layer 240 of the volatile memory 132. The first compression chunk may include a first compressed object group 910 and a second compressed object group 920. The first compression chunk may include seven compressed objects that are positioned across the first compressed object group 910 and the second compressed object group 920. The processor 120 may store compressed objects included in the first compressed object group 910 and the second compressed object group 920 in a corresponding temporary buffer (e.g., a temporary buffer classified for each compression size of a compressed object) (e.g., the third buffer 243 in FIG. 4) of the temporary buffer layer 240. Storage slot A and storage slot B of the non-volatile memory 134 may be treated as including invalid data and may be erased later. Storage slot C and storage slot D of the non-volatile memory 134 are storage slots that are already invalidated.

Furthermore, for example, when the second compression chunk is selected as the target compression chunk, the processor 120 may copy compressed object groups stored in storage slot E and storage slot H of the non-volatile memory 134 to the temporary buffer layer 240 of the volatile memory 132. The second compression chunk may include a third compressed object group 930 and a fourth compressed object group 940. The third compressed object group 930 may include one compressed object. The fourth compressed object group 940 may include two compressed objects. The processor 120 may store compressed objects included in the third compressed object group 930 and the fourth compressed object group 940 in a corresponding temporary buffer of the temporary buffer layer 240. Storage slot E and storage slot H of the non-volatile memory 134 may be treated as including invalid data and may be erased later. Storage slot F and storage slot G of the non-volatile memory 134 are storage slots that are already invalidated.

According to an embodiment, the processor 120 may update the first bitmap 310 and the second bitmap 320. For example, the processor 120 may change bit 0 and bit 1 of the first bitmap 310 and bit 0, bit 1, bit 4, and bit 7 of the second bitmap 320 from used bits to free bits.

According to an embodiment, the processor 120 may reorganize the compressed objects in the first compressed object group 910, the second compressed object group 920, the third compressed object group 930, and the fourth compressed object group 940, which are stored in the temporary buffer layer 240, into a new compressed object group and may store the reorganized compressed objects again in the non-volatile memory 134 through the compressed data transfer operation between heterogeneous memories of FIG. 6.

According to an embodiment, after performing the defragmentation operation, the processor 120 may map bit 0, bit 1, bit 2, and bit 3 of the second bitmap 320 to unused free slots (e.g., slot I, slot J, slot K, and slot L) of the non-volatile memory 134, respectively. Furthermore, the processor 120 may change (or update) bit 0 of the first bitmap 310 and bit 0, bit 1, bit 2, and bit 3 of the second bitmap 320 to used bits. As such, the processor 120 may secure a free bit (e.g., bit 1 of the first bitmap 310) in the first bitmap 310 and may defragment the non-volatile memory 134.

Figure 10:
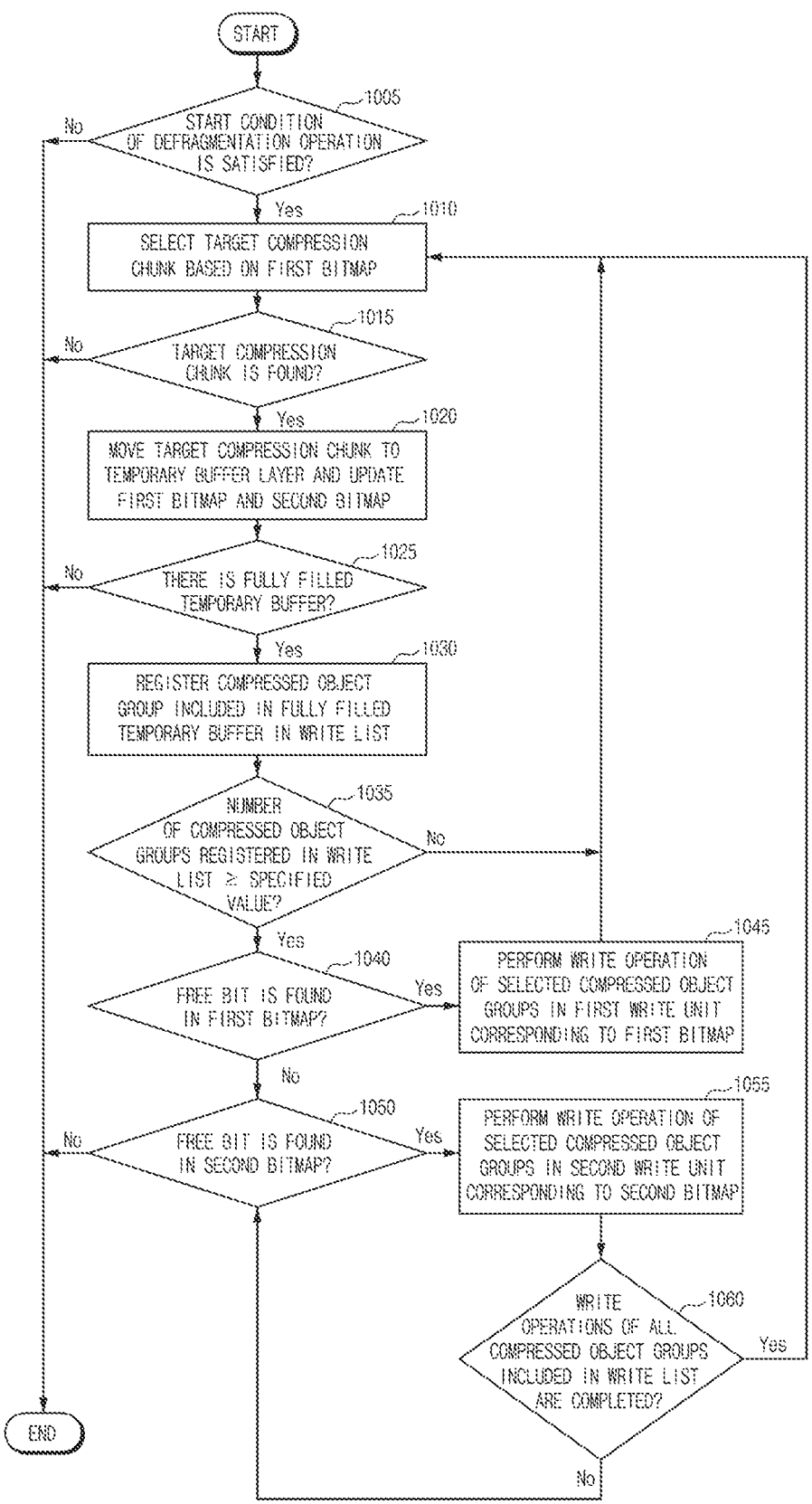
FIG. 10 is a flowchart illustrating a defragmentation operation of a non-volatile memory of an electronic device, according to an embodiment of the disclosure.

FIG. 10 is a flowchart illustrating a defragmentation operation of a non-volatile memory of an electronic device, according to an embodiment of the disclosure.

Referring to FIGS. 2, 9, and 10, a non-volatile memory 134 may be fragmented (e.g., a storage slot (e.g., storage slot C, D, F, or G) not mapped to the lower bitmap is present between storage slots (e.g., storage slots A, B, E, and H) mapped to the lower bitmap) depending on a usage pattern (e.g., a read operation, a write operation, or an erase operation). As such, the processor 120 may change (or update) the mapping between the lower bitmap and storage slots of the non-volatile memory 134 such that storage slots mapped to the lower bitmap are located to be continuously adjacent to each other through a defragmentation operation (e.g., defragmentation). The processor 120 may change (or update) the upper bitmap depending on a change in the lower bitmap.

According to an embodiment, in operation 1005, the processor 120 may determine whether a start condition of the defragmentation operation is satisfied. For example, because the performance of the electronic device 101, which is perceived by a user, may be degraded during the defragmentation operation, the processor 120 may perform the defragmentation operation by using a period in time in which a user input is not entered. For example, the processor 120 may identify an idle time of the electronic device 101. The processor 120 may determine the idle time of the electronic device 101 based on an off time or local time (e.g., early morning hours (00:00~05:00)) of a display (e.g., the display module 160). Moreover, the processor 120 may determine whether the defragmentation operation is necessary. For example, when the upper bitmap includes used bits having a specified percentage or higher, the processor 120 may perform the defragmentation operation. When the usable lifespan of the non-volatile memory 134 is not less than a reference value (e.g., when a wear level is sufficiently low), the processor 120 may perform the defragmentation operation. When the start condition of the defragmentation operation is not satisfied, the processor 120 may not perform the defragmentation operation. When the start condition of the defragmentation operation is satisfied, the processor 120 may perform operation 1010.

According to an embodiment, in operation 1010, the processor 120 may select a target compression chunk based on the first bitmap (e.g., an upper bitmap). For example, the processor 120 may select a compression chunk (or a compression chunk, which has the number of bits of the mapped second bitmap (or a lower bitmap) that corresponds to a specified ratio or less and which corresponds to the used bit of the first bitmap) (e.g., a compression chunk corresponding to bit 0 of the first bitmap 310 in FIG. 9 or compression chunk corresponding to bit 1 of the first bitmap 310 in FIG. 9), which has the usage amount corresponding to a specified ratio (e.g., 50%) or less, as a target compression chunk based on a used bit of the first bitmap.

According to an embodiment, in operation 1015, the processor 120 may determine whether the target compression chunk is found. When the target compression chunk is not present, the processor 120 may terminate the defragmentation operation. When the target compression chunk is found, the processor 120 may perform operation 1020.

According to an embodiment, in operation 1020, the processor 120 may move the target compression chunk from the non-volatile memory 134 to the temporary buffer layer 240 of the volatile memory 132. For example, the target compression chunk may include at least one compressed object group. The processor 120 may store compressed objects included in the target compression chunk in the corresponding temporary buffer (e.g., a temporary buffer classified for each compression size of a compressed object) of the temporary buffer layer 240. Furthermore, the processor 120 may update a bit corresponding to the target compression chunk in the first bitmap and the second bitmap (e.g., change the bit from a used bit to a free bit). For example, in FIG. 9, when the target compression chunk corresponds to bit 0 of the first bitmap 310 of FIG. 9, the processor 120 may change bit 0 of the first bitmap 310, and bit 0 and bit 1 of the second bitmap 320 from used bits to free bits. Alternatively, when the target compression chunk corresponds to bit 1 of the first bitmap 310 in FIG. 9, the processor 120 may change bit 1 of the first bitmap 310 and bit 4 and bit 7 of the second bitmap 320 from used bits to free bits.

According to an embodiment, in operation 1025, operation 1030, operation 1035, operation 1040, operation 1045, operation 1050, operation 10555, and operation 1060, the processor 120 may move the selected compressed object group from the volatile memory 132 to the non-volatile memory 134 in a method the same as or similar to a method of operation 620 to operation 655 of FIG. 6. Descriptions associated with operation 1025 to operation 1060 are the same as or similar to operation 620 to operation 655 of FIG. 6 are omitted. When a fully filled temporary buffer is not present, in operation 1025, the processor 120 may terminate the defragmentation operation. When there is no free bit in the second bitmap, in operation 1050, the processor 120 may terminate the defragmentation operation.

Figure 11:
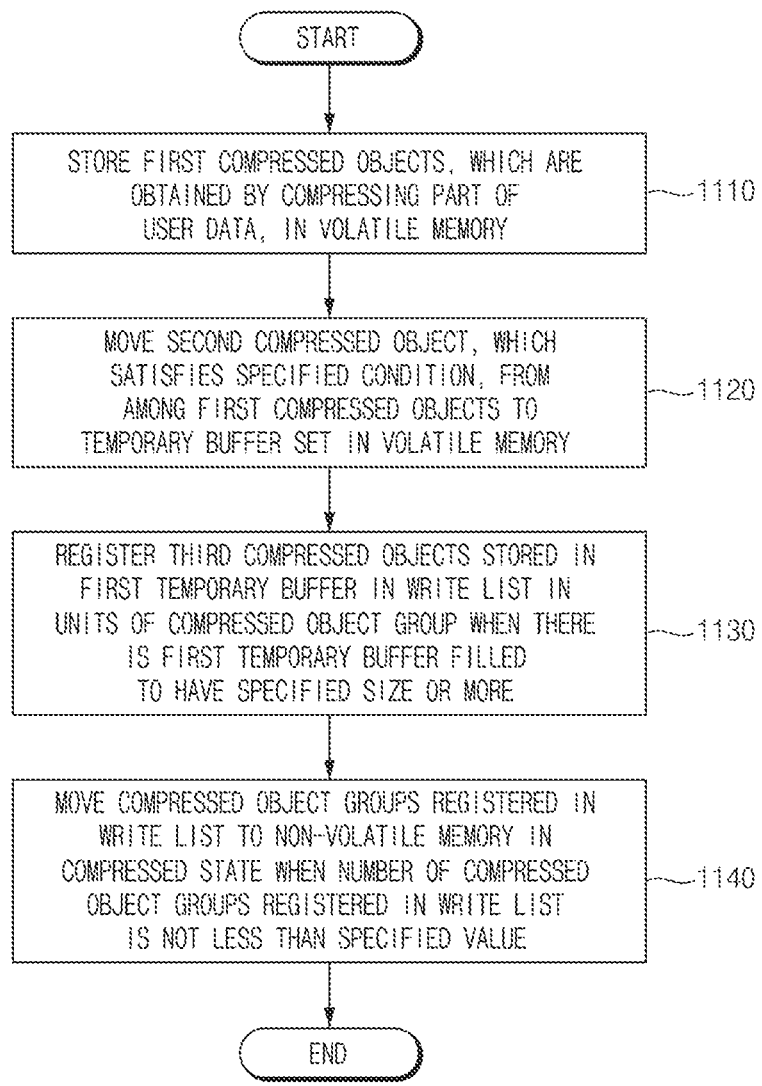
FIG. 11 is a flowchart illustrating a method of moving compressed data between heterogeneous memories of an electronic device, according to an embodiment of the disclosure.

FIG. 11 is a flowchart illustrating a method of moving compressed data between heterogeneous memories of an electronic device, according to an embodiment of the disclosure.

Referring to FIGS. 2 and 11, an electronic device 101 may include a processor 120 and a memory 130. The memory 130 may include the volatile memory 132 and the non-volatile memory 134. The processor 120 may control the memory 130 by executing a program (e.g., the program 140). The non-volatile memory 134 may include the plurality of storage slots 260. According to the method of moving compressed data between heterogeneous memories in this specification, the processor 120 may move compressed data from the volatile memory 132 to the non-volatile memory 134, thereby efficiently securing free space of the volatile memory 132.

According to an embodiment, in operation 1110, the processor 120 may store first compressed objects (e.g., the compressed objects 230), which are obtained by compressing a part of the user data 210 stored in the volatile memory 132 in units of page (e.g., 4 Kilobytes), in the empty area 220 of the volatile memory 132. For example, when free space of the volatile memory 132 is reduced to have a specified size (e.g., 10% of the size of the volatile memory 132), the processor 120 may generate the compressed objects 230 by compressing the part of the user data 210 in units of pages, may store the compressed objects 230 in the empty area 220 of the volatile memory 132, and may delete original data (e.g., the first page data 211 of FIG. 2).

According to an embodiment, in operation 1120, the processor 120 may move a second compressed object (e.g., the idle object 232), which satisfies a specified condition (e.g., when there is no access to the corresponding compressed object during a specified time), from among the first compressed objects to at least one temporary buffer (e.g., the first buffer 241, the second buffer 242, or the third buffer 243 in FIG. 4) set in the volatile memory 132.

For example, when a command to move compressed data is triggered by an operating system (e.g., the operating system 142 of FIG. 1), the processor 120 may search for the idle object 232 (e.g., a compressed object that is shaded in FIG. 2) among the compressed objects 230. The idle object 232 may be defined as a compressed object, which has no access during a specified period or more, from among the compressed objects 230. For example, the processor 120 may attach an idle flag to all of the compressed objects 230 at a specified time point. When access to the compressed objects 230 is present, the processor 120 may remove an idle flag of the corresponding compressed object. After the specified period elapses from the specified time point, the processor 120 may select a compressed object having the idle flag as the idle object 232. For another example, when the compressed data moving operation between heterogeneous memories is completed, the processor 120 may attach an idle flag to all the compressed objects 230. When triggering the next compressed data moving command, the processor 120 may select a compressed object having an idle flag as the idle object 232. The processor 120 may determine whether an object is the idle object 232, from the oldest compressed object.

For example, the processor 120 may generate the temporary buffer layer 240 in the empty area 220 of the volatile memory 132. The temporary buffer layer 240 may include the at least one temporary buffer. For example, the at least one temporary buffer may be classified for each size and may store the second compressed object. The processor 120 may set a storage limit size for the at least one respective temporary buffer. For example, when the size of the second compressed object is not greater than a first compression size (e.g., 32 Bytes), the processor 120 may move the second compressed object to the first buffer 241 of FIG. 4. When the size of the second compressed object is greater than the first compression size and is not greater than a second compression size (e.g., 818 bytes), the processor 120 may move the second compressed object to the second buffer 242 of FIG. 4. When the size of the second compressed object is greater than the second compression size and is not greater than a third compression size (e.g., 1168 bytes), the processor 120 may move the second compressed object to the third buffer 243 of FIG. 4. For another example, the at least one temporary buffer may be set to have a different size. For example, the processor 120 may set the first buffer 241 and the second buffer 242 of FIG. 4 to have the first buffer size BS1. The processor 120 may set the third buffer 243 of FIG. 4 to have the second buffer size BS2 greater than the first buffer size BS1. The first buffer size BS1 may be set to correspond to a size (e.g., 4 Kilobytes) of one storage slot (e.g., the first storage slot 261) of the non-volatile memory 134. The second buffer size BS2 may be set to a multiple (e.g., 8 Kilobytes) of the first buffer size BS1.

According to an embodiment, in operation 1130, when there is a first temporary buffer (e.g., the third buffer 243 in FIG. 4), which is filled (or fully filled) to have a specified size or more, from among the at least one temporary buffer, the processor 120 may register third compressed objects stored in the first temporary buffer in a write list in units of compressed object group (e.g., 4 Kilobytes). For example, the processor 120 may search for a temporary buffer having free space, of which the size is less than a storage limit size (e.g., the third compression size in the third buffer 243 of FIG. 4), as the first temporary buffer. The first temporary buffer may include at least one compressed object group. The size of one compressed object group may correspond to a size (e.g., 4 Kilobytes) of one storage slot of the non-volatile memory 134. For example, the first buffer 241 or the second buffer 242 of FIG. 4, which has the first buffer size BS1, may include one compressed object group. When the second buffer size BS2 is twice the first buffer size BS1, the third buffer 243 of FIG. 4 having the second buffer size BS2 may include two compressed object groups.

According to an embodiment, in operation 1140, when the number of compressed object groups registered in the write list is not less than a specified value, the processor 120 may move the compressed object groups registered in the write list to the non-volatile memory 134 in a compressed state. For example, the processor 120 may divide compressed object groups registered in the write list in units of compression chunk (e.g., 4 Kilobytes*N, 'N' is a natural number greater than 2). The processor 120 may move a plurality of compression chunks to the non-volatile memory 134 at a time (or continuously). One compression chunk may include a plurality of compressed object groups.

For example, to manage compression chunks and compressed object groups, the processor 120 may use a plurality of hierarchical bitmaps. For example, the processor 120 may generate an upper bitmap (e.g., the first bitmap 310 in FIG. 3) and a lower bitmap (e.g., the second bitmap 320 in FIG. 3). Bits of the lower bitmap may be mapped one-to-one to storage slots of the non-volatile memory 134. The plurality of bits of the lower bitmap may be mapped to one bit of the upper bitmap. Accordingly, one bit of the upper bitmap may correspond to a plurality of storage slots of the non-volatile memory 134. The compressed object group may be defined as a collection of compressed objects corresponding to one bit of the lower bitmap. The compression chunk may be defined as a collection of compressed object groups corresponding to one bit of the upper bitmap.

For example, each bit of the upper bitmap or the lower bitmap may be displayed as a free bit (e.g., displayed as "0" in binary) or a used bit (e.g., displayed as "1" in binary). For example, a bit of the lower bitmap mapped to a storage slot of the non-volatile memory 134 in which a compressed object group is stored may be displayed as a used bit. A bit of the lower bitmap mapped to a storage slot of the non-volatile memory 134 in which a compressed object group is not stored may be displayed as a free bit. A bit of the upper bitmap mapped to at least one used bit of the lower bitmap may be displayed as a used bit. When all bits of the lower bitmap mapped to a specific bit of the upper bitmap are free bits, the specific bit of the upper bitmap may be expressed as a free bit.

For example, the processor 120 may search for a free bit from the upper bitmap prior to the lower bitmap. When there is a free bit in the upper bitmap, the processor 120 may move compressed object groups registered in the write list to the non-volatile memory 134 in units of compression chunk unit at a time (or continuously). Compressed object groups included in the same compression chunk may be stored in adjacent storage slots of the non-volatile memory 134. When there is no free bit in the upper bitmap, the processor 120 may search for a free bit in the lower bitmap. The processor 120 may move one of the compressed object groups registered in the write list in units of compressed object group so as to correspond to the found free bit of the lower bitmap. Until all compressed object groups registered in the write list are stored, the processor 120 may repeatedly search for a free bit of the lower bitmap and may repeatedly move the compressed object group.

As described above, the processor 120 may secure free space of the volatile memory 132 by compressing some of the user data 210. Furthermore, the processor 120 may further secure free space of the volatile memory 132 by moving compressed objects, in each of which some of the user data 210 is compressed, to the non-volatile memory 134. Moreover, the processor 120 may move the compressed objects to the non-volatile memory 134 in a compressed state, thereby efficiently securing the free space of the volatile memory 132. In addition, the processor 120 may perform write operations of compressed objects for each unit (e.g., in units of compression chunk) larger than one storage slot of the non-volatile memory 134, thereby improving the write performance of the non-volatile memory 134 during a write operation.

According to an embodiment, an electronic device 101 include a volatile memory 132 storing user data a non-volatile memory 134 and a processor 120 operatively connected to the volatile memory 132 and the non-volatile memory 134. The processor 120 is configured to store first compressed objects, which are obtained by compressing some of the user data in a page unit, in an empty area of the volatile memory 132, move a second compressed object, which satisfies a specified condition, from among the first compressed objects to a temporary buffer set in the volatile memory 132, and based on the temporary buffer being filled to a specified size or more, move third compressed objects, which are stored in the temporary buffer, to the non-volatile memory 134 in a compressed state.

According to an embodiment, the processor 120 is further configured to, set a temporary buffer layer including a plurality of temporary buffers in the volatile memory 132, and based on a compression size, select one of the plurality of temporary buffers in which the second compressed object is to be stored.

According to an embodiment, the processor 120 is further configured to determine a size of the temporary buffer to have a size equal to a size of one storage slot of the non-volatile memory 134 or a size corresponding to a multiple of the size of the one storage slot of the non-volatile memory 134.

According to an embodiment, the processor 120 is further configured to, based on the temporary buffer being filled to a specified size or more, classify the third compressed objects as a compressed object group and register the compressed object group in a write list, and based on a number of compressed object groups registered in the write list being more than or equal to a specified value, move the registered compressed object groups to the non-volatile memory 134.

According to an embodiment, the non-volatile memory 134 includes a plurality of storage slots, and the processor 120 is further configured to, sequentially store the registered compressed object groups in adjacent storage slots among the plurality of storage slots.

According to an embodiment, a size of the compressed object group is set to be equal to a size of one of the plurality of storage slots.

According to an embodiment, a size of the compressed object group is set to be equal to the page unit.

According to an embodiment, the non-volatile memory 134 includes a plurality of storage slots, and the processor 120 is further configured to, generate a first bitmap and a second bitmap that have a hierarchical structure with each other, map bits of the second bitmap to the plurality of storage slots one-to-one, and map a plurality of bits of the second bitmap to one bit of the first bitmap.

According to an embodiment, the processor 120 is further configured to, classify the third compressed objects as a compressed object group corresponding to a size of one of the plurality of storage slots, and sequentially store compressed object groups corresponding to one bit of the first bitmap in adjacent storage slots among the plurality of storage slots.

According to an embodiment, the processor 120 is further configured to, display a bit of the second bitmap mapped to a storage slot, in which each of the compressed object groups is stored, as a used second bit, and display a bit of the first bitmap mapped to at least one used bit of the second bitmap as a used first bit.

According to an embodiment, the processor 120 is further configured to, based on receiving a read request for a compressed object moved to the non-volatile memory 134, copy a target compressed object group including the read-requested compressed object to the volatile memory 132, decompress the read-requested compressed object and delete remaining compressed objects included in the target compressed object group from the volatile memory 132, maintain the target compressed object group stored in the non-volatile memory 134, and maintain the first bitmap and the second bitmap in current states.

According to an embodiment, the processor 120 is further configured to:

based on receiving a read request for a compressed object moved to the non-volatile memory 134, move a target compression chunk, which includes the read-requested compressed object and which corresponds to one bit of the first bitmap, to the volatile memory 132, decompress the read-requested compressed object, store remaining compressed objects included in the target compression chunk in the temporary buffer, and update bits of the first bitmap and the second bitmap corresponding to the target compression chunk to free bits.

According to an embodiment, the specified condition includes selecting a compressed object, which has no access during a specified time, from among the first compressed objects.

According to an embodiment, a method of moving compressed data between heterogeneous memories of an electronic device 101 including a volatile memory 132 and a non-volatile memory 134, may include storing first compressed objects, which are obtained by compressing user data stored in the volatile memory 132 in a page unit, in an empty area of the volatile memory 132, moving a second compressed object, which satisfies a specified condition, from among the first compressed objects to at least one temporary buffer set in the volatile memory 132, based on a first temporary buffer from among the at least one temporary buffer being filled to a specified size or more, registering third compressed objects stored in the first temporary buffer in a write list in units of a compressed object group and based on a number of compressed object groups registered in the write list being more than or equal to a specified value, moving the compressed object groups to the non-volatile memory 134 in compressed states 134.

According to an embodiment, the method of moving compressed data between heterogeneous memories of an electronic device may further include generating a first bitmap and a second bitmap that have a hierarchical structure with each other, wherein bits of the second bitmap are mapped one-to-one to storage slots of the non-volatile memory 134, and wherein at least two bits of the second bitmap are mapped to one bit of the first bitmap.

According to an embodiment, the method of moving compressed data between heterogeneous memories of an electronic device may further include, when a first free bit is included in the first bitmap, sequentially moving the compressed object groups to storage slots corresponding to the first free bit among the plurality of storage slots.

According to an embodiment, the method of moving compressed data between heterogeneous memories of an electronic device may further include, when a first free bit is not included in the first bitmap, searching for a second free bit in the second bitmap and when the second free bit is included in the second bitmap, moving one compressed object group among the compressed object groups to a first storage slot corresponding to the second free bit among the plurality of storage slots.

According to an embodiment, the method of moving compressed data between heterogeneous memories of an electronic device may further include, when a third free bit is included in the second bitmap, moving another compressed object group among the compressed object groups to a second storage slot corresponding to the third free bit among the plurality of storage slots.

According to an embodiment, wherein the at least one temporary buffer comprises a first temporary buffer set to correspond to a size of one storage slot of the non-volatile memory and a second temporary buffer set to a multiple of the size of the first temporary buffer.

According to an embodiment, wherein the at least one temporary buffer comprises a first temporary buffer storing at least one compressed object of which a size is not greater than a first compression size and a second temporary buffer storing at least one compressed object of which the size is greater than the first compression size and is smaller than a second compression size.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively," as "coupled with," "coupled to," "connected with," or "connected to" another element (e.g., a second element), it denotes that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply denotes that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a volatile memory storing user data;
   a non-volatile memory; and
   a processor operatively connected to the volatile memory and the non-volatile memory,
   wherein the processor is configured to:
      store first compressed objects, which are obtained by compressing some of the user data in a page unit, in an empty area of the volatile memory,
      move a second compressed object, which satisfies a specified condition, from among the first compressed objects to a temporary buffer set in the volatile memory, and
      based on the temporary buffer being filled to a specified size or more, move third compressed objects, which are stored in the temporary buffer, to the non-volatile memory in a compressed state.

2. The electronic device of claim 1, wherein the processor is further configured to:
   set a temporary buffer layer including a plurality of temporary buffers in the volatile memory, and
   based on a compression size, select one of the plurality of temporary buffers in which the second compressed object is to be stored.

3. The electronic device of claim 1, wherein the processor is further configured to:
   determine a size of the temporary buffer to have a size equal to a size of one storage slot of the non-volatile memory or a size corresponding to a multiple of the size of the one storage slot of the non-volatile memory.

4. The electronic device of claim 1, wherein the processor is further configured to:
   based on the temporary buffer being filled to a specified size or more, classify the third compressed objects as a compressed object group and register the compressed object group in a write list, and
   based on a number of compressed object groups registered in the write list being more than or equal to a specified value, move the registered compressed object groups to the non-volatile memory.

5. The electronic device of claim 4,
   wherein the non-volatile memory includes a plurality of storage slots, and wherein the processor is further configured to:
sequentially store the registered compressed object groups in adjacent storage slots among the plurality of storage slots.

6. The electronic device of claim 5, wherein a size of the compressed object group is set to be equal to a size of one of the plurality of storage slots.

7. The electronic device of claim 4, wherein a size of the compressed object group is set to be equal to the page unit.

8. The electronic device of claim 1,
wherein the non-volatile memory includes a plurality of storage slots, and
wherein the processor is further configured to:
generate a first bitmap and a second bitmap that have a hierarchical structure with each other,
map bits of the second bitmap to the plurality of storage slots one-to-one, and
map a plurality of bits of the second bitmap to one bit of the first bitmap.

9. The electronic device of claim 8, wherein the processor is further configured to:
classify the third compressed objects as a compressed object group corresponding to a size of one of the plurality of storage slots, and
sequentially store compressed object groups corresponding to one bit of the first bitmap in adjacent storage slots among the plurality of storage slots.

10. The electronic device of claim 9, wherein the processor is further configured to:
display a bit of the second bitmap mapped to a storage slot, in which each of the compressed object groups is stored, as a used second bit, and
display a bit of the first bitmap mapped to at least one used bit of the second bitmap as a used first bit.

11. The electronic device of claim 10, wherein the processor is further configured to:
based on receiving a read request for a compressed object moved to the non-volatile memory, copy a target compressed object group including the read-requested compressed object to the volatile memory,
decompress the read-requested compressed object and delete remaining compressed objects included in the target compressed object group from the volatile memory,
maintain the target compressed object group stored in the non-volatile memory, and
maintain the first bitmap and the second bitmap in current states.

12. The electronic device of claim 10, wherein the processor is further configured to:
based on receiving a read request for a compressed object moved to the non-volatile memory, move a target compression chunk, which includes the read-requested compressed object and which corresponds to one bit of the first bitmap, to the volatile memory,
decompress the read-requested compressed object,
store remaining compressed objects included in the target compression chunk in the temporary buffer, and
update bits of the first bitmap and the second bitmap corresponding to the target compression chunk to free bits.

13. The electronic device of claim 1, wherein the specified condition includes selecting a compressed object, which has no access during a specified time, from among the first compressed objects.

14. A method of moving compressed data between heterogeneous memories of an electronic device including a volatile memory and a non-volatile memory, the method comprising:
storing first compressed objects, which are obtained by compressing user data stored in the volatile memory in a page unit, in an empty area of the volatile memory;
moving a second compressed object, which satisfies a specified condition, from among the first compressed objects to at least one temporary buffer set in the volatile memory;
based on a first temporary buffer from among the at least one temporary buffer being filled to a specified size or more, registering third compressed objects stored in the first temporary buffer in a write list in units of a compressed object group; and
based on a number of compressed object groups registered in the write list being more than or equal to a specified value, moving the compressed object groups to the non-volatile memory in compressed states.

15. The method of claim 14, further comprising:
generating a first bitmap and a second bitmap that have a hierarchical structure with each other,
wherein bits of the second bitmap are mapped one-to-one to a plurality of storage slots of the non-volatile memory, and
wherein at least two bits of the second bitmap are mapped to one bit of the first bitmap.

16. The method of claim 15, further comprising:
when a first free bit is included in the first bitmap, sequentially moving the compressed object groups to storage slots corresponding to the first free bit among the plurality of storage slots.

17. The method of claim 15, further comprising:
when a first free bit is not included in the first bitmap, searching for a second free bit in the second bitmap; and
when the second free bit is included in the second bitmap, moving one compressed object group among the compressed object groups to a first storage slot corresponding to the second free bit among the plurality of storage slots.

18. The method of claim 17, further comprising:
when a third free bit is included in the second bitmap, moving another compressed object group among the compressed object groups to a second storage slot corresponding to the third free bit among the plurality of storage slots.

19. The method of claim 14, wherein the at least one temporary buffer comprises a first temporary buffer set to correspond to a size of one storage slot of the non-volatile memory and a second temporary buffer set to a multiple of the size of the first temporary buffer.

20. The method of claim 14, wherein the at least one temporary buffer comprises a first temporary buffer storing at least one compressed object of which a size is not greater than a first compression size and a second temporary buffer storing at least one compressed object of which the size is greater than the first compression size and is smaller than a second compression size.

* * * * *